(12) United States Patent
Chua et al.

(10) Patent No.: US 9,009,399 B2
(45) Date of Patent: Apr. 14, 2015

(54) FLASH MEMORY STORAGE SYSTEM AND CONTROLLER AND DATA WRITING METHOD THEREOF

(71) Applicant: Phison Electronics Corp., Miaoli (TW)

(72) Inventors: Lai-Hock Chua, Miaoli (TW); Kheng-Chong Tan, Miaoli (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 14/520,352

(22) Filed: Oct. 22, 2014

(65) Prior Publication Data
US 2015/0039820 A1 Feb. 5, 2015

Related U.S. Application Data

(62) Division of application No. 12/709,926, filed on Feb. 22, 2010, now Pat. No. 8,904,086.

(30) Foreign Application Priority Data

Dec. 31, 2009 (TW) ................................ 98146208 A

(51) Int. Cl.
*G06F 12/00* (2006.01)
*G06F 12/02* (2006.01)
*G11C 16/10* (2006.01)
*G06F 12/08* (2006.01)

(52) U.S. Cl.
CPC .... *G06F 12/0246* (2013.01); *G06F 2212/7205* (2013.01); *G11C 16/102* (2013.01); *G06F 2212/214* (2013.01); *G06F 12/0866* (2013.01)

(58) Field of Classification Search
CPC ............ G06F 12/0246; G06F 12/0866; G11C 16/102
See application file for complete search history.

(56) References Cited

U.S. PATENT DOCUMENTS

2006/0236063 A1* 10/2006 Hausauer et al. ............. 711/170
2008/0215800 A1* 9/2008 Lee et al. ....................... 711/103
2009/0193182 A1* 7/2009 Nitta ............................. 711/103

* cited by examiner

*Primary Examiner* — Matthew Bradley
*Assistant Examiner* — Craig Goldschmidt
(74) *Attorney, Agent, or Firm* — Jianq Chyun IP Office

(57) ABSTRACT

A flash memory storage system having a flash memory controller and a flash memory chip is provided. The flash memory controller configures a second physical unit of the flash memory chip as a midway cache physical unit corresponding to a first physical unit and temporarily stores first data corresponding to a first host write command and second data corresponding to a second host write command in the midway cache physical unit, wherein the first and second data corresponding to slow physical addresses of the first physical unit. Then, the flash memory controller synchronously copies the first and second data from the midway cache physical unit into the first physical unit, thereby shortening time for writing data into the flash memory chip.

13 Claims, 16 Drawing Sheets

FLASH MEMORY STORAGE SYSTEM AND CONTROLLER AND DATA WRITING METHOD THEREOF

CROSS-REFERENCE TO RELATED APPLICATION

This is a divisional application of and claims the priority benefit of a prior application Ser. No. 12/709,926, filed on Feb. 22, 2010, now allowed. The prior application Ser. No. 12/709,926 claims the priority benefit of Taiwan application serial No. 98146208, filed on Dec. 31, 2009. The entirety of each of the above-mentioned patent applications is hereby incorporated by reference herein and made a part of this specification.

BACKGROUND

1. Technology Field

The present invention generally relates to a flash memory storage system, and more particularly, to a flash memory storage system that can store data fast, and a flash memory controller and a data writing method thereof.

2. Description of Related Art

Along with the widespread of digital cameras, cell phones, and MP3 in recently years, the consumers' demand to storage media has increased drastically. Flash memory is one of the most adaptable memories for such battery-powered portable products due to its characteristics such as data non-volatility, low power consumption, small volume, and non-mechanical structure. A memory card is a storage device adopting NAND flash memory as storage medium. Flash memory has been broadly used for storing important personal data thanks to its small volume and large capacity. Therefore, the flash memory industry has become a very important part of the electronic industry in recent years.

In current NAND flash memory technology, a flash memory may be classified into a Single Level Cell (SLC) NAND flash memory or a Multi Level Cell (MLC) NAND flash memory according to the number of bits which each memory cell thereof is capable of storing. To be specific, the programming of a SLC NAND flash memory only has one phase, therefore each memory cell only can store one bit of data. The programming of the MLC NAND memory has several phases. Taking a 2 level cell NAND flash memory as an example, the physical blocks thereof are programmed in two phases. The first phase is the programming of a lower page, and the physical property of the programming of the lower page is similar to the physical property of the programming of the SLC NAND memory. After the first phase is completed, the programming of an upper page may be executed (i.e., the second phase), wherein the speed of programming the lower page is faster than that of programming the upper page. Therefore, pages in each physical block may be categorized into slow pages (i.e., upper pages) and fast pages (i.e., lower pages).

Similarly, in an 8 level cell or a 16 level cell, each memory cell contains more pages and accordingly is programmed in more phases. Herein, the pages having the fastest programming speed are defined as the "fast pages", and all other pages having slower programming speed are defined as the "slower pages". For example, the "slower pages" may include a plurality of pages having different programming speeds. Additionally, in other cases, the "slower pages" may been defined as the pages having the slowest programming speed, or the pages having the slowest programming speed and some of the pages having faster programming speeds than the slowest programming speed. For example, in a 4-level memory cell, the fast pages are defined as the pages having the fastest and the second fastest programming speed, while the slow pages are defined as the pages having the slowest and the second slowest programming speed.

Compared with the MLC NAND flash memory, the access speed of the SLC NAND flash memory is faster. However, compared to the SLC NAND flash memory, the capacity of the MLC NAND flash memory is larger and the cost of the MLC NAND flash memory is lower. Thereby, how to increase the access speed of the MLC NAND flash memory to improve the performance of a flash memory storage apparatus is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a flash memory storage system capable of effectively increasing the speed of writing data into a flash memory.

The present invention is directed to a flash memory controller capable of effectively increasing the speed of writing data into a flash memory.

The present invention is directed to a data writing method capable of effectively increasing the speed of writing data into a flash memory.

According to an exemplary embodiment of the present invention, a flash memory storage system including a flash memory chip and a flash memory controller is proposed. The flash memory chip has a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The flash memory controller is coupled to the flash memory chip and configured to receive a plurality of third data from a host system and temporarily store the third data into the fast physical addresses, wherein the third data corresponds to the slow physical addresses. Additionally, when the quantity of the third data temporarily stored in the fast physical addresses reaches a predetermined value, the flash memory controller writes at least portion of at least two pieces of the third data into the slow physical addresses corresponding to the third data in a synchronization mechanism, wherein the predetermined value is not smaller than 2.

According to an exemplary embodiment of the present invention, a flash memory storage system including a flash memory chip, a connector, and a flash memory controller is proposed. The flash memory chip has a first plane and a second plane. The first plane and the second plane respectively include a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The connector is configured to couple to a host system. The flash memory controller is coupled to the flash memory chip and the connector, and configured to group the physical blocks of the first and second planes into a plurality of physical units and group a portion of the physical units into a data area and a spare area, wherein each of the physical units includes one of the physical blocks of the first plane and one of the physical blocks of the second plane. Herein the flash memory controller is further operative to receive first data corresponding to a first write command, wherein the first data corresponds to a first physical block of a first physical unit and the first physical unit belongs to the first plane. Additionally, the flash memory controller is further operative to get one physical unit form the spare area as a midway cache physical unit corresponding to the first physical unit. Moreover, the flash memory controller is further operative to determine whether the first data is small data and corresponds to a first slow physical address of the first physical block of the first physical unit. And, when the first data is the small data and corresponds to the first slow physical address, the flash memory controller is further operative to temporarily store the first data into one of fast physical addresses of a first physical block of the midway cache physical unit, wherein the first physical block of the midway cache physical unit belongs the first plane.

According to an exemplary embodiment of the present invention, a flash memory controller for writing a plurality of data into a flash memory chip is proposed. The flash memory chip has a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The flash memory controller includes a microprocessor unit, a flash memory interface unit and a memory management unit. The flash memory interface unit is coupled to the microprocessor unit for coupling to the flash memory chip. The memory management unit is coupled to the microprocessor unit and has a plurality of program codes for providing to the microprocessor unit to perform a plurality of procedures. The microprocessor unit is operative to receive a plurality of third data from a host system and temporarily store the third data into the fast physical addresses, wherein the third data corresponds to the slow physical addresses. Herein, when the quantity of the third data temporarily stored in the fast physical addresses reaches a predetermined value, the microprocessor unit is further operative to write at least portion of at least two pieces of the third data into the slow physical addresses corresponding to the third data in a synchronization mechanism, wherein the predetermined value is not smaller than 2.

According to an exemplary embodiment of the present invention, a flash memory controller for writing a plurality of data into a flash memory chip is proposed. The flash memory chip has a first plane and a second plane. The first plane and the second plane respectively include a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The flash memory controller includes a microprocessor unit, a flash memory interface unit, a host interface unit, and a memory management unit. The flash memory interface unit is coupled to the microprocessor unit and configured to couple to the flash memory chip. The host interface unit is coupled to the microprocessor unit and configured to couple to a host system. The memory management unit is coupled to the microprocessor unit and has a plurality of program codes for providing to the microprocessor unit to perform a plurality of procedures. The microprocessor unit is operative to group the physical blocks of the first and second planes into a plurality of physical units and group a portion of the physical units into a data area and a spare area, wherein each of the physical units includes one of the physical blocks of the first plane and one of the physical blocks of the second plane. Herein the microprocessor unit is further operative to receive first data corresponding to a first write command, wherein the first data corresponds to a first physical block of a first physical unit and the first physical unit belongs to the first plane. Additionally, the microprocessor unit is further operative to get one physical unit form the spare area as a midway cache physical unit corresponding to the first physical unit. Moreover, the microprocessor unit is further operative to determine whether the first data is small data and corresponds to a first slow physical address of the first physical block of the first physical unit. And, when the first data is the small data and corresponds to the first slow physical address, the microprocessor unit is further operative to temporarily store the first data into one of fast physical addresses of a first physical block of the midway cache physical unit, wherein the first physical block of the midway cache physical unit belongs the first plane.

According to an exemplary embodiment of the present invention, a data writing method for writing a plurality of data from a host system into a flash memory chip is proposed. The flash memory chip has a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The data writing method includes receiving a plurality of third data from a host system and temporarily storing the third data into the fast physical addresses, wherein the third data corresponds to the slow physical addresses. Herein, The data writing method also includes when the quantity of the third data temporarily stored in the fast physical addresses reaches a predetermined value, writing at least portion of at least two pieces of the third data into the slow physical addresses corresponding to the third data in a synchronization mechanism, wherein the predetermined value is not smaller than 2.

According to an exemplary embodiment of the present invention, a data writing method for writing a plurality of data from a host system into a flash memory chip is proposed. The flash memory chip has a first plane and a second plane. The first plane and the second plane respectively include a plurality of physical blocks, and each of the physical blocks has a plurality of physical addresses. The physical addresses include a plurality of fast physical addresses and slow physical addresses and the speed of writing data into the fast physical addresses is faster than the speed of writing data into the slow physical addresses. The data writing method includes grouping the physical blocks of the first and second planes into a plurality of physical units and grouping a portion of the physical units into a data area and a spare area, wherein each of the physical units includes one of the physical blocks of the first plane and one of the physical blocks of the second plane. The data writing method also includes receiving first data corresponding to a first write command, wherein the first data corresponds to a first physical block of a first physical unit and the first physical unit belongs to the first plane. The data writing method still includes getting one physical unit form the spare area as a midway cache physical unit corresponding to the first physical unit. The data writing method further includes when the first data is the small data and corresponds to the first slow physical address, temporarily storing the first data into one of fast physical addresses of a first physical block of the midway cache physical unit, wherein the first physical block of the midway cache physical unit belongs the first plane.

As described above, the exemplary embodiment of the invention can effectively shortening time for writing data into a flash memory and improving the performance of a flash memory apparatus.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
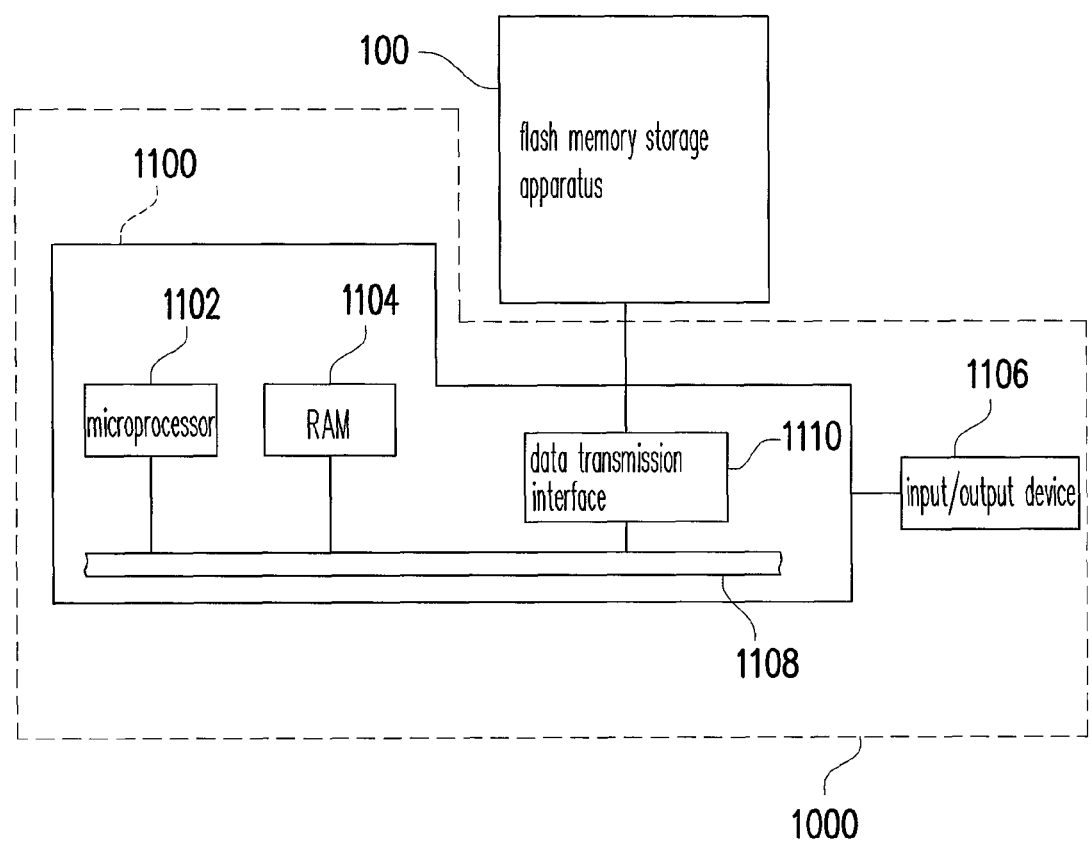
FIG. 1A is a schematic diagram showing a host system using a flash memory storage apparatus according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Flash memory storage apparatus (i.e., a flash memory storage system), typically, includes a flash memory chip and a controller (i.e., a control circuit). The flash memory storage apparatus is usually used together with a host system so that the host system can write data into or read data from the flash memory storage apparatus. In addition, a flash memory storage apparatus also includes an embedded flash memory and a software that can be executed by a host system and substantially served as a controller of the embedded flash memory.

FIG. 1A is a schematic diagram showing a host system using a flash memory storage apparatus according to one embodiment of the present invention.

Figure 1B:
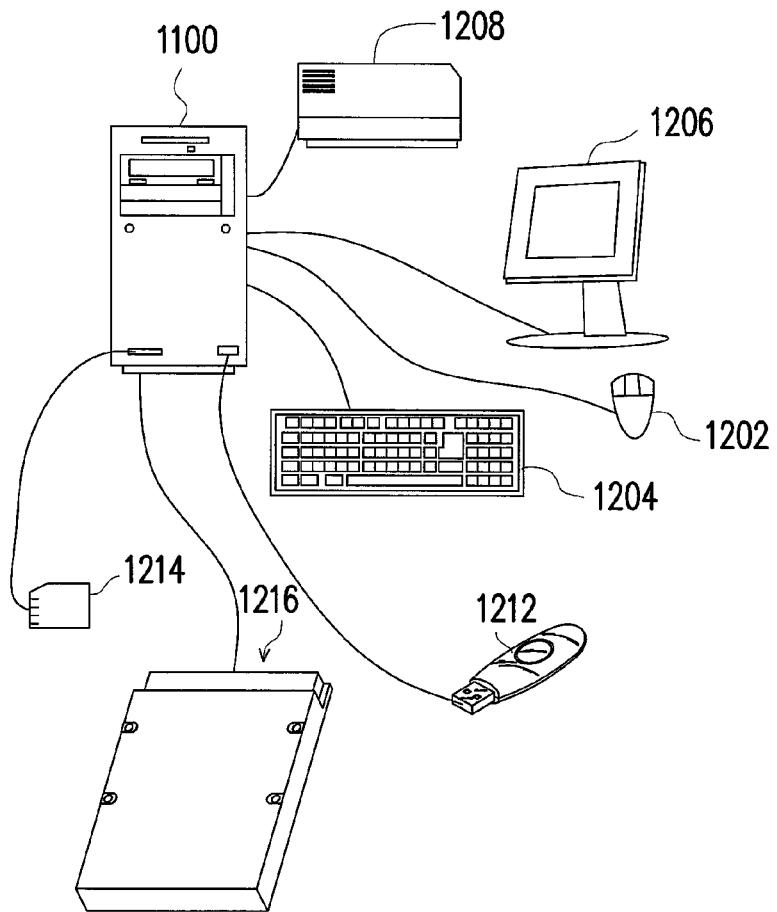
FIG. 1B is a diagram illustrating a computer, an input/output (I/O) device, and a flash memory storage apparatus according to an exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the devices illustrated in FIG. 1B are not intended to limit the scope of the I/O device 1106, and the I/O device 1106 may further include other devices.

In the exemplary embodiment of the present invention, the flash memory storage apparatus 100 is coupled to the devices of the host system 1000 through the data transmission interface 1110. By using the microprocessor 1102, the random access memory (RAM) 1104 and the Input/Output (I/O) device 1106, the data can be write into the flash memory storage apparatus 100 or can be read from the flash memory storage apparatus 100. The flash memory storage apparatus 100 may be a flash drive 1212, a memory card 1214, or a solid state drive (SSD) 1216, as shown in FIG. 1B.

Figure 1C:
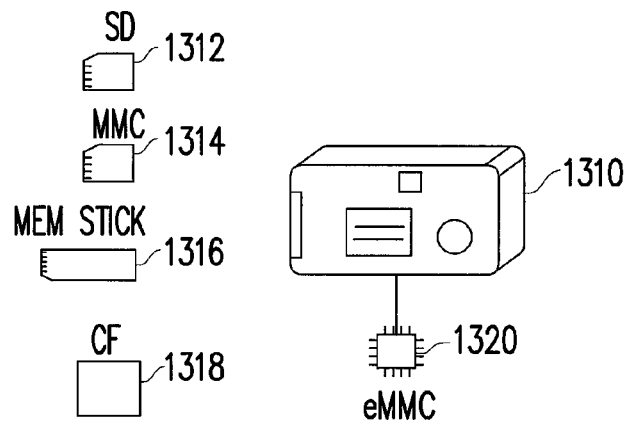
FIG. 1C is a diagram of a host system and a flash memory storage device according to another exemplary embodiment of the present invention.

Generally, the host system 1000 substantially can be any system capable of storing data. Even though the host system 1000 is described as a computer system in the exemplary embodiment, in another exemplary embodiment of the present invention, the host system 1000 may also be a digital camera, a video camera, a communication device, an audio player, or a video player, and etc. For example, if the host system 1000 is a digital camera 1310, the flash memory storage apparatus 100 is then a SD card 1312, a MMC card 1314, a memory stick 1316, a CF card 1318, or an embedded storage device 1320 used in the digital camera 1310 (as shown in FIG. 1C) The embedded storage device 1320 includes an embedded MMC (eMMC). It should be mentioned that the eMMC is directly coupled to a substrate of the host system 1000.

Figure 2:
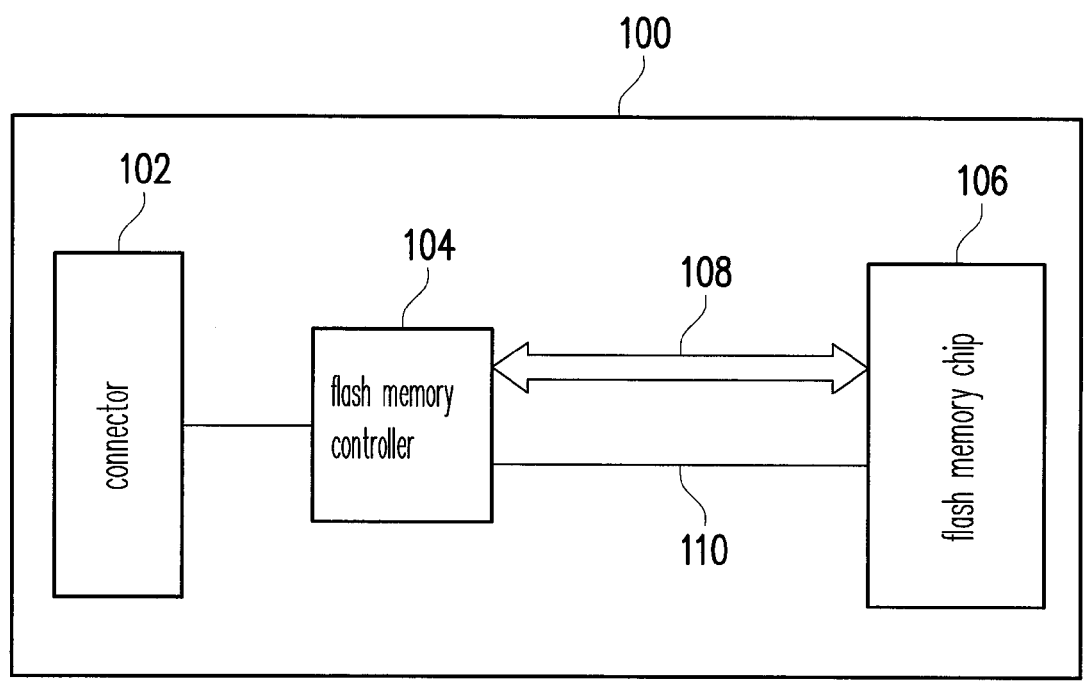
FIG. 2 is a schematic block diagram of the flash memory storage apparatus in FIG. 1A.

FIG. 2 is a schematic block diagram of the flash memory storage apparatus in FIG. 1A.

Referring to FIG. 2, the flash memory storage apparatus 100 includes a connector 102, a flash memory controller 104, and a flash memory chip 106.

The connector 102 is coupled to the flash memory controller 104 and used for coupling to the host system 1000. In the exemplary embodiment, the connector 102 is a secure digital (SD) interface connector. However, it should be noticed that the present invention is not limited to the aforementioned description and the connector 102 also can be a universal serial bus (USB) connector, an institute-of-electrical-and-electronic-engineers (IEEE) 1394 connector, a peripheral-component Interconnect-express (PCI Express) connector, a Serial Advanced Technology Attachment (SATA) connector, a memory stick (MS) interface connector, a multi-media-card (MMC) interface connector, a compact flash (CF) interface connector, an integrated-device-electronics (IDE) connector or other suitable type of connectors.

The flash memory controller 104 executes a plurality of logic gates or control commands implemented in a hardware form or a firmware form and performs various data operations such as data writing, reading, and erasing in the flash memory chip 106 according to commands of the host system 1000.

Figure 3:
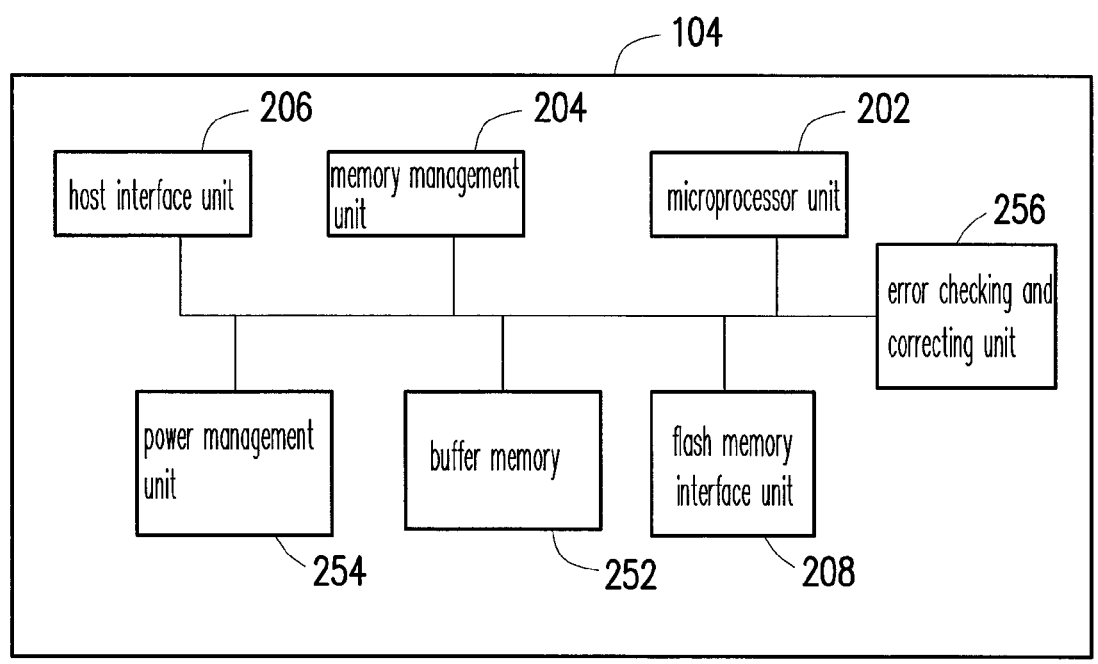
FIG. 3 is a schematic block diagram of a flash memory controller according to one exemplary embodiment of the present invention.

FIG. 3 is a schematic block diagram of a flash memory controller according to one exemplary embodiment of the present invention.

Referring to FIG. 3, the flash memory controller 104 includes a microprocessor unit 202, a memory management unit 204, a host interface unit 206 and a flash memory interface unit 208.

The microprocessor unit 202 is a main control unit of the flash memory controller 104. The microprocessor unit 202 is configured to execute memory management firmware codes to cooperate with the host interface unit 206, and the flash memory interface unit 208 to carry out various operations of the flash memory storage apparatus 100.

The memory management unit 204 is coupled to the microprocessor unit 202, and configured for be operated with the microprocessor unit 202 to perform a data access mechanism and a block management mechanism according to the exemplary embodiment. Below, the data access mechanism and the block management mechanism will be described in detail with reference to accompanying drawings.

In the exemplary embodiment, the memory management unit 204 is implemented in the flash memory controller 104 in a firmware form. For example, the memory management unit 204 including a plurality of control instructions is burned into a program memory (for example, a read only memory (ROM)), and the program memory is embedded into the flash memory controller 104. When the flash memory storage apparatus 100 is in operation, the control instructions of the memory management unit 204 are executed by the microprocessor unit 202 to accomplish the data access mechanism and the block management mechanism according to the exemplary embodiment.

In another exemplary embodiment of the invention, the control commands of the memory management unit 204 are stored in a specific area (for example, the system area of a flash memory chip exclusively used for storing system data) of the flash memory chip 106 as program codes. Additionally, the memory management unit 204 may have a read only memory and a random access memory. And, the read only memory has a driver code, and the microprocessor unit 202 executes the driver code to load the control instructions of the memory management unit 204 stored in the flash memory chip 106 into the random access memory of the memory management unit 204, and then accomplish the data access mechanism and the block management mechanism according to the exemplary embodiment based on the control instructions. In addition, in yet another exemplary embodiment of the invention, the memory management unit 204 may also be implemented in the flash memory controller 104 in a hardware form.

The host interface unit 206 is coupled to the microprocessor unit 202, and configured for receiving and identifying commands and data from the host system 1000. Namely, the commands and data from the host system 1000 are transmitted to the microprocessor unit 202 through the host interface unit 206. In the exemplary embodiment, the host interface unit 206 is a SD interface corresponding to the connector 102. However, it should be understood that the invention is not limited thereto, and the host interface unit 210 can be a PATA interface, a USB interface, an IEEE 1394 interface, a PCI express interface, a SATA interface, a MS interface, a MMC interface, a CF interface, an IDE interface, or other suitable data transmission interfaces.

The flash memory interface unit 208 is coupled to the microprocessor unit 202 and configured for accessing the flash memory chip 106. Namely, data to be written into the flash memory chip 106 is converted by the flash memory interface unit 208 into a format acceptable to the flash memory chip 106.

In another exemplary embodiment of the present invention, the flash memory controller still includes a buffer memory 252. The buffer memory 252 is coupled to the microprocessor unit 202 and configured to temporarily store data and commands from the host system 1000 or data from the flash memory chip 106.

In another exemplary embodiment of the present invention, the flash memory controller still includes a power management unit 254. The power management unit 254 is coupled to the microprocessor unit 202, and configured to control the power supply of the flash memory storage apparatus 100.

In another exemplary embodiment of the present invention, the flash memory controller still includes an error checking and correcting unit 256. The error checking and correcting unit 256 is coupled to the microprocessor unit 202, and configured for executing an error checking and correcting procedure to ensure data accuracy. To be specific, when the microprocessor unit 202 receives a write command from the host system 1000, the error checking and correcting unit 256 generates an error checking and correcting (ECC) code for the data corresponding to the write command, and the microprocessor unit 202 writes the data and the corresponding ECC code into the flash memory chip 106. Subsequently, when the microprocessor unit 202 reads the data from the flash memory chip 106, the microprocessor 202 simultaneously reads the corresponding ECC code, and the error correction unit 256 executes the error checking and correcting procedure on the data based on the ECC code corresponding to the data.

Referring to FIG. 2 again, the flash memory chip 106 is used as a storage medium of the flash memory storage apparatus 100 for storing data from the host system 1000. The flash memory chip 106 is coupled to the flash memory controller 104 via a data bus 108 and a chip enable pin 110. In the exemplary embodiment, the flash memory chip 106 is a multi level cell (MLC) NAND flash memory chip.

Figures 4A, 4B:
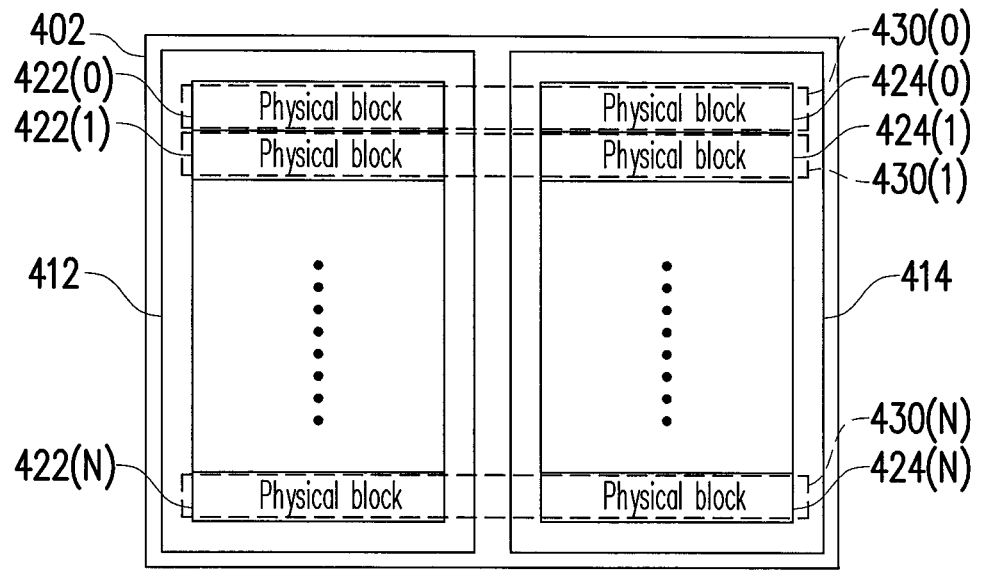
FIG. 4A is a schematic block diagram showing a flash memory chip according to one embodiment of the present invention.
FIG. 4B is a schematic block diagram showing a physical block according to one embodiment of the present invention.

FIG. 4A is a schematic block diagram showing a flash memory chip according to one embodiment of the present invention, and FIG. 4B is a schematic block diagram showing a physical block according to one embodiment of the present invention.

Referring to FIGS. 4A and 4B, the flash memory chip 106 includes a flash memory die 402. It should be mentioned that even though the flash memory chip 106 only includes one flash memory die in the exemplary embodiments. However, the present invention is not limited thereto, and in another exemplary embodiment, the flash memory chip may be composed of several flash memory dies.

The flash memory die 402 has a first plane 412 and a second plane 414. The first flash memory die 412 has physical blocks 422-(0)~422-(N), and the second flash memory die 414 has physical blocks 424-(0)~424-(N). Each physical block is the smallest erasing unit. That is to say, each physical block contains the least number of memories that are erased together. Each of the physical blocks is usually divided into a plurality of physical addresses (i.e., physical pages). Since in the exemplary embodiment, the flash memory chip 106 is a MLC NAND flash memory chip, thus a smallest unit for programs is one physical page. In other words, each physical page is the smallest unit for writing data or reading data. Each physical page usually includes a user data bit area and a redundant bit area. The user data bit area is for storing the data of a user, and the redundancy bit area is for storing system data (e.g. an error checking and a correcting code (ECC code)). In the exemplary embodiment, the capacity of each physical page is 8 kilobytes. Additionally, in the exemplary embodiment, the flash memory chip 106 is a 2 level cell NAND flash memory chip, and the physical addresses of the physical blocks 422(0)~422(N) and 424(0)~424(N) is classified into fast physical addresses (also referred to "fast physical pages") and slow physical addresses (also referred to "slow physical pages"). In particular, the speed of writing data into the fast physical addresses is faster than that of writing data into the slow physical addresses. For example, taking the physical block 430(S+1) as an example, a $0^{th}$ physical address, a $2^{nd}$ physical address, a $4^{th}$ physical address, . . . , a $(K-1)^{th}$ physical address are fast physical addresses, and a $1^{st}$ physical address, a $3^{rd}$ physical address, a $5^{th}$ physical address, . . . , a $(K)^{th}$ physical address are slow physical addresses. However, it should be noted that in another exemplary embodiment, the flash memory chip may be a 3 level cell NAND flash memory chip, a 4 level cell NAND flash memory chip or other MLC NAND flash memory chip.

It should be noted that in the present exemplary embodiment, the first plane 412 and the second plane 414 is configured in the flash memory die 402, and the flash memory controller 104 transmits data to or receive data from the first plane 412 and the second plane 414 via a single data bus 108. However, in a case where the flash memory chip has a plurality of flash memory dies, the first plane 412 and the second plane 414 may be configured in different flash memory dies, respectively, and the flash memory controller 104 transmits data to the first plane 412 and the second plane 414 via different data buses, respectively.

In the exemplary embodiment, the number of physical pages in each physical block is 128. However, it should be noted that the present is not limited thereto and in another exemplary embodiment, the number of physical pages in each physical block may be 192, 256, or other suitable value. In addition, the physical blocks of the plane 412 and the second plane 414 are usually grouped into a plurality of zones. By managing the physical blocks 422-(0)~422-(N) and the physical blocks 424-(0)~424-(N) by each individual zone, the operations for the physical blocks can be parallelized and the complexity of managing the physical blocks can be simplified.

Moreover, the microprocessor unit 202 of the flash memory controller 104 logically groups the physical blocks of the first plane 412 and the second plane 414 into a plurality of physical units for management. For example, one physical unit includes 2 physical blocks and one physical unit is used as a unit of erasing data. In the exemplary embodiment, the physical blocks 422-(0)~422-(N) and the physical blocks 424-(0)~424-(N) are logically grouped into physical units 430-(0)~430-(N). It should be understood that, in the present exemplary embodiment, the management is based on each physical unit having 2 physical blocks. However, the present invention is not limited thereto, and in another exemplary embodiment of the present invention, each physical unit may be composed of one or more physical blocks.

FIGS. 5A~5D are diagrams of managing the flash memory chip according to one exemplary embodiment of the present invention.

It should be understood that the terms used herein for describing the operations (for example, "get", "select", "replace", "group", and "alternate", etc) performed on the physical blocks of a flash memory refer to logical operations performed on these physical blocks. Namely, the physical blocks in the flash memory are only logically operated and the actual positions thereof are not changed.

Figure 5A:
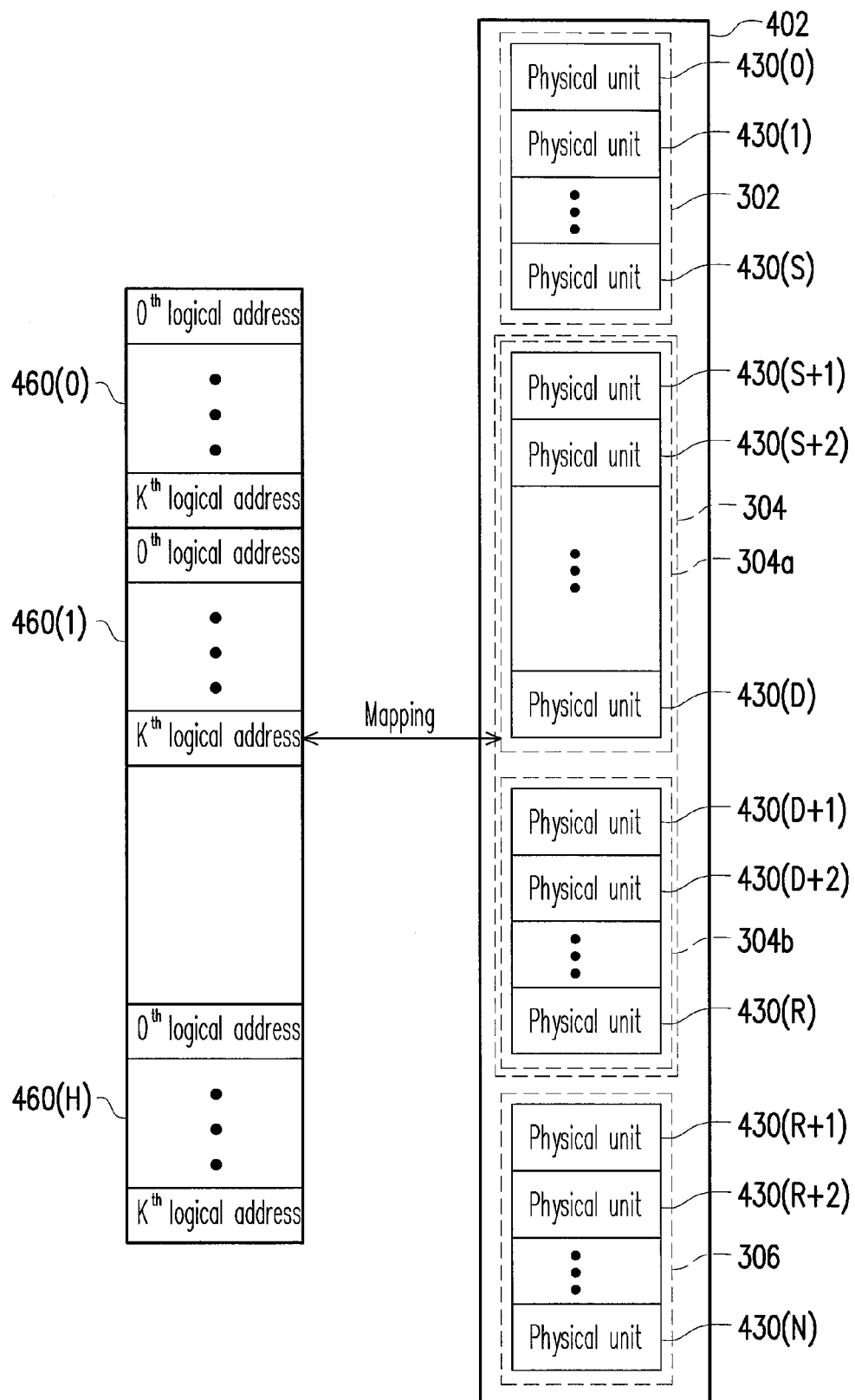
FIGS. 5A~5D are diagrams of managing the flash memory chip according to one exemplary embodiment of the present invention.

Referring to FIG. 5A, the microprocessor unit 202 logically groups the physical units 430(0)~430(N) into a system area 302, a storage area 304, and a replacement area 306.

The physical units logically belonging to the system area 302 are used for recording the system data, which includes information related to the manufacturer and a model of the flash memory chip, the number of planes in each flash memory die, the number of the physical blocks in each plane, the number of physical pages in each physical block, and so forth.

The physical units logically belonging to the storage area 304 are used for storing data written by the host system 1000. Namely, the flash memory storage apparatus 100 uses the physical units in the storage area 304 for actually storing data written by the host system 1000. In particular, in the exemplary embodiment, the microprocessor unit 202 groups the physical units in the storage area 304 into a data area 304a and a spare area 304b. The physical units logically belonging to the data area 304a are physical units mapped to logical units accessed by the host system 1000. That is, the physical units of the data area 304a are units which store valid data. And, the physical units of the spare area 304b are used for substituting the physical units of the data area. Hence, the physical units in the spare area 304b are either blank or available units (i.e., no data is recorded in these units or data recorded in these units is marked as invalid data). In other words, the physical units of the data area 304a and the spare area 304b are alternated to store the data written into the flash memory storage apparatus 100 by the host system 1000.

Figure 5B:
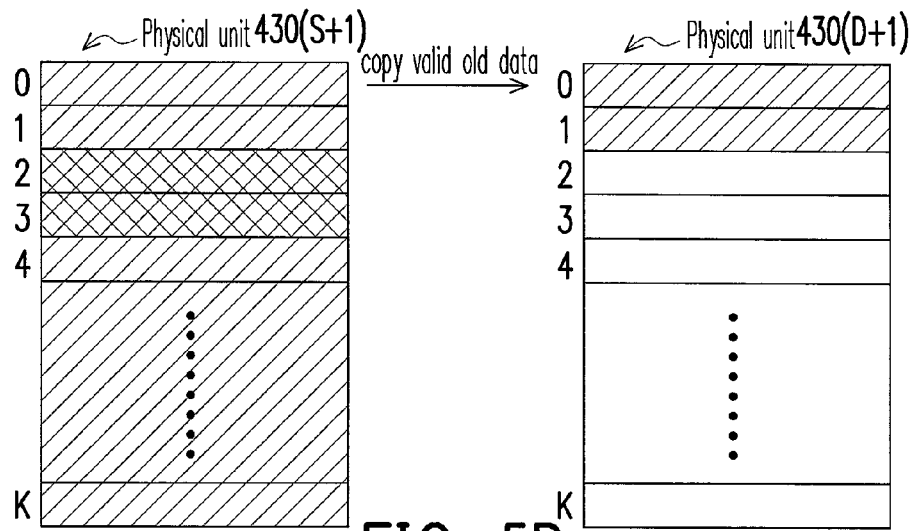
Figure 5C:
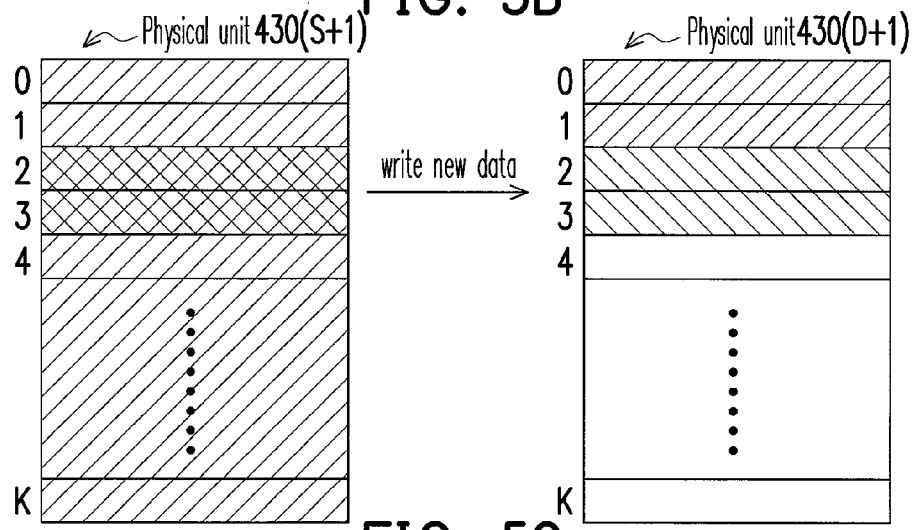
Figure 5D:
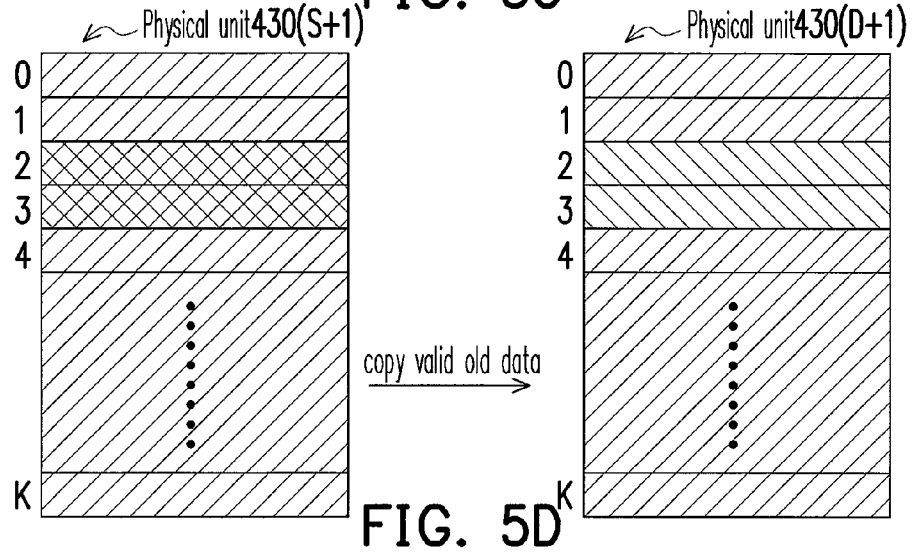

Referring to FIGS. 5B~5D, for example, when the flash memory controller 104 receives a write command from the host system 1000 and is about to write data into the physical unit 430(S+1) of the data area 304a, the microprocessor unit 202 gets the physical unit 430(D+1) from the spare area 304b as a substitute physical unit to substitute the physical unit 430(S+1) of the data area 304a. However, the microprocessor unit 202 does not instantly move all the valid data of the physical unit 430(S+1) to the physical unit 430(D+1) and erase the physical unit 430(S+1) while the microprocessor unit 202 writes new data into the physical unit 430(D+1). To be specific, the microprocessor unit 202 copies the valid data before the physical address for writing the new data (i.e., the $0^{th}$ physical address and the $1^{st}$ physical address) in the physical block 430(S+1) to the physical block 430(D+1) (as shown in FIG. 5B) and writes the new data (i.e., the $2^{nd}$ physical address and the $3^{rd}$ physical address) into the physical block 430(D+1) (as shown in FIG. 5C). At this time, the microprocessor unit 202 has completed the write command. Since the valid data in the physical unit 430(S+1) may become invalid in a next operation (for example, a write command), instantly moving all the valid data from the physical unit 430(S+1) to the physical unit 430(D+1) may be unnecessary. In the exemplary embodiment, the operation of temporarily keeping this temporary relationship (i.e., a relationship between the physical block 430(S+1) and the physical block 430(D+1)) is referred to as an "operation of opening mother-child units".

Thereafter, when actually combining the contents of the physical unit 430(S+1) and the physical unit 430(D+1), the microprocessor unit 202 integrates the physical unit 430(S+1) with the physical unit 430(D+1) into one physical unit, and thereby enhances efficiency of use of the blocks. The operation of integrating is also referred to as an "operation of closing mother-child units". For example, as shown in FIG. 5D, when the operation of closing the mother-child units is performed, the microprocessor unit 202 copies rest of the valid data (i.e., the $4^{th}$~$K^{th}$ physical addresses) of the physical unit 430(S+1) to the substitute physical unit 430(D+1), and then erases the physical unit 430(S+1) and associates the physical unit 430(S+1) with the spare area 304b. Meanwhile, the physical unit 430(D+1) is associated with the data area 304a.

The physical units logically belonging to the replacement area 306 are replacement physical units. For example, when the flash memory chip 106 is manufactured in the factory, 4% of the physical units thereof are reserved for replacement. Namely, when the physical units in the system area 302 and the storage area 304 are damaged, the physical units reserved in the replacement area 306 can be used for replacing the damaged physical units (i.e., bad units). Thus, if there are still normal physical units in the replacement area 306 and a physical unit is damaged, the microprocessor unit 202 gets a normal physical unit from the replacement area 306 for replacing the damaged physical unit. If there is no more normal physical unit in the replacement area 306 and a physical unit is damaged, the flash memory storage apparatus 100 is announced as being in a write-protect status and cannot be used for writing data anymore.

In particular, the numbers of the physical units in the system area 302, storage area 304 and replacement area 306 are various based on different flash memory chips. Additionally, it has to be understood that the grouping relationships of grouping the physical units into the system area 302, the storage area 304, and the replacement area 306 are dynamically changed during the operation of the flash memory storage apparatus 100. For example, when a physical unit in the storage area is damaged and replaced by a physical unit in the replacement area, the physical unit in the replacement area is associated with the storage area.

In the exemplary embodiment, logical addresses are configured for the host system 1000 to properly access data in the physical units storing data with the alternate mechanism. Additionally, the microprocessor unit 202 groups the logical addresses into logical units 460(0)~460(H) and maps the logical units 460(0)~460(H) to the physical blocks of the data area 304a (as shown in FIG. 5A).

For example, in a case where the logical unit 460(0) maps to the physical unit 430(S+1), when the host system 1000 is about to write data into logical addresses belonging to the logical unit 460(0), the microprocessor unit 202 identifies the logical unit 460(0) that the logical addresses belong to according to a configuration unit (not shown) or a mathematic operation formula. After that, the microprocessor unit 202 identifies the physical unit 430(S+1) mapped to the logical unit 460(0) according to a logical unit-physical unit mapping table, gets the physical unit 430(D+1) from the spare area 304b, and writes the valid data in the physical unit 430(S+1) and data written by the host system 1000 into the physical unit 430(D+1). Then, the microprocessor unit 202 updates the logical unit-physical unit mapping table to re-map the logical unit 460(0) to the physical unit 430(D+1).

In particular, in the exemplary embodiment, besides the above-mentioned general writing operation (as shown in FIGS. 5B~5D), the microprocessor unit 202 gets physical units from the spare area 304b as midway cache physical units and temporarily stores small data, that is about to be written into slow physical addresses, in fast physical addresses of the midway cache physical units. In particular, the microprocessor unit 202 synchronously programs a plurality of data temporarily stored in the midway cache physical unit into the corresponding slow physical addresses, thereby increasing the speed for writing data. Herein, when the size of data written by the host system 1000 is smaller than or equal to the capacity of one physical address (i.e., one physical page), the microprocessor unit 202 considers the data as "small data". For example, if it is assumed that the capacity of each physical address is 8 kilobytes, the microprocessor unit 202 considers data that is smaller than or equal to 8 kilobytes as the "small data".

FIGS. 6~14 are diagrams illustrating an example of writing small data according to one embodiment of the present invention.

Figure 6:
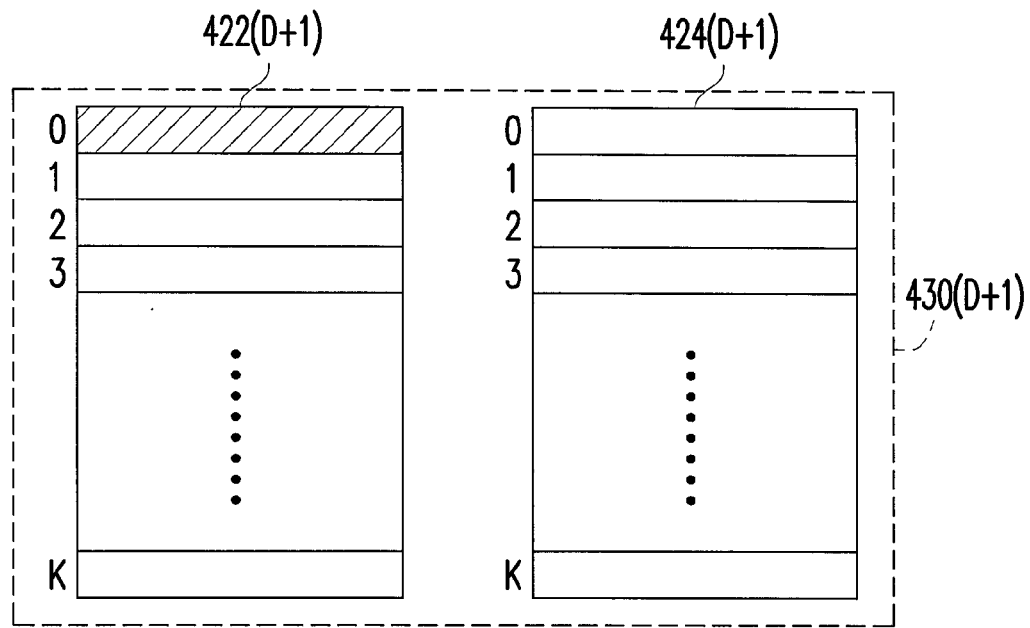
FIGS. 6~14 are diagrams illustrating an example of writing small data according to one embodiment of the present invention.

Referring to FIG. 6, it is assumed that under a status where the logical unit 460(0) maps the physical unit 430(S+1), when the host system 1000 gives a first write command to write data starting from the $0^{th}$ logical address of the logical unit 460(0) and the data is the small data, the microprocessor unit 202 gets the physical unit 430(D+1) and identifies that the $0^{th}$ physical address of the physical unit 430(D+1) (i.e., the $0^{th}$ physical address of the physical block 422(D+1)) for writing the data is the fast physical address. Accordingly, the microprocessor unit 202 directly writes the data corresponding to the first write command into the $0^{th}$ physical address of the physical block 422(D+1) of the physical unit 430 (D+1). It is should mentioned that because the program of the flash memory chip 106 is in a unit of each physical address, the microprocessor unit 202 pads data and makes that the size of the padded data is equal to the size of one physical address if the data corresponding to a write command can not fill one physical address.

Figure 7:
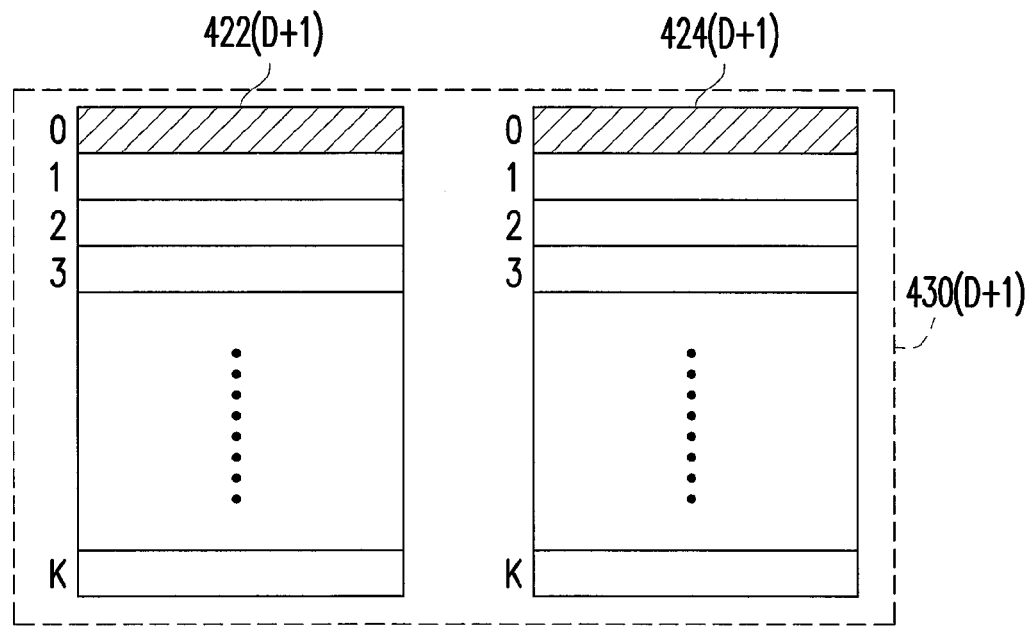

Referring to FIG. 7, when under the status shown in FIG. 6, the host system 1000 gives a second write command to write data starting from the $1^{st}$ logical address of the logical unit 460(0) and the data is the small data, the microprocessor unit 202 identifies that the $1^{st}$ physical address of the physical unit 430(D+1) (i.e., the $0^{th}$ physical address of the physical block 424(D+1)) for writing the data is the fast physical address. Accordingly, the microprocessor unit 202 directly writes the data corresponding to the second write command into the $0^{th}$ physical address of the physical block 424(D+1) of the physical unit 430 (D+1).

Figure 8:
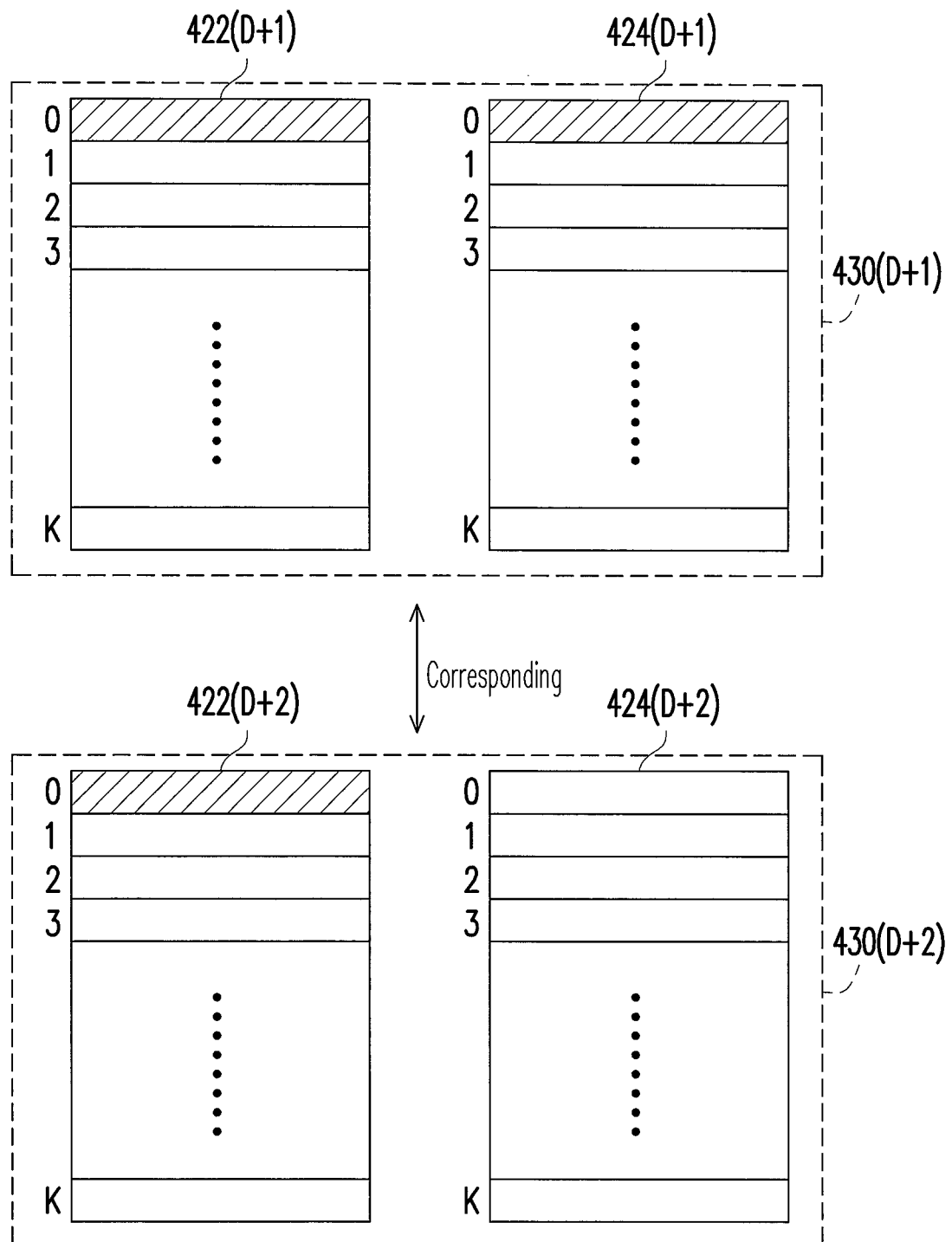

Referring to FIG. 8, when under the status shown in FIG. 7, the host system 1000 gives a third write command to write data starting from the $2^{nd}$ logical address of the logical unit 460(0) and the data is the small data, the microprocessor unit 202 identifies that the $2^{nd}$ physical address of the physical unit 430(D+1) (i.e., the $1^{st}$ physical address of the physical block 422(D+1)) for writing the data is the slow physical address. Accordingly, the microprocessor unit 202 gets the physical unit 430(D+2) from the spare 304b as a midway cache physical unit corresponding to the physical unit 430(D+1), and temporarily stores the data corresponding to the third write command in the fast physical address (i.e., the $0^{th}$ physical address of the physical block 422(D+2)) of the midway cache physical unit 430(D+2). Here, the physical blocks of the midway cache physical unit 430(D+2) are also referred to "midway cache physical blocks".

Figure 9:
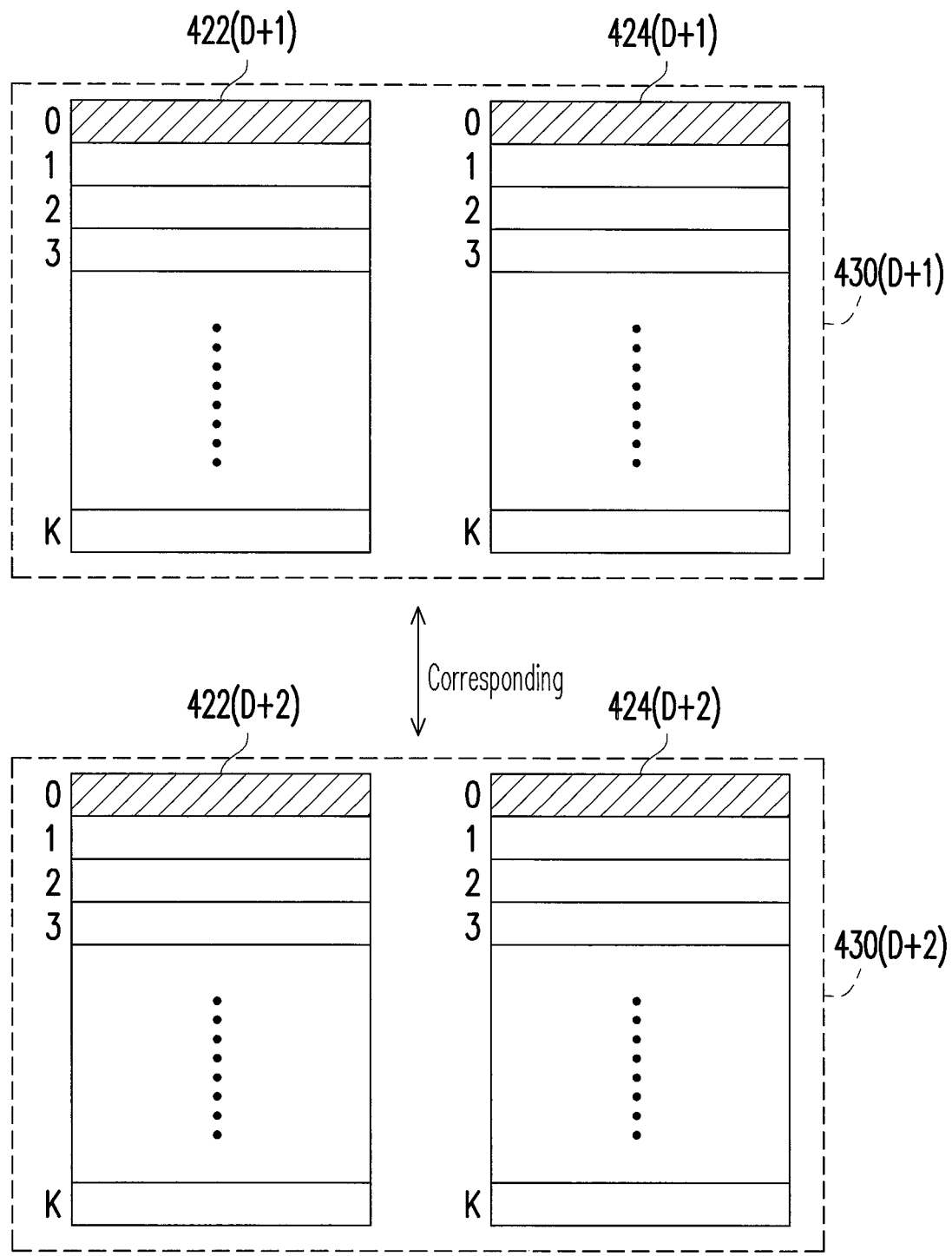

Referring to FIG. 9, when under the status shown in FIG. 8, the host system 1000 gives a fourth write command to write data starting from the $3^{rd}$ logical address of the logical unit 460(0) and the data is the small data, the microprocessor unit 202 identifies that the $3^{rd}$ physical address of the physical unit 430(D+1) (i.e., the $1^{st}$ physical address of the physical block 424(D+1)) for writing the data is the slow physical address. Accordingly, the microprocessor unit 202 temporarily stores the data corresponding to the fourth write command in the fast physical address (i.e., the $0^{th}$ physical address of the physical block 424(D+2)) of the midway cache physical unit 430(D+2).

Figure 10:
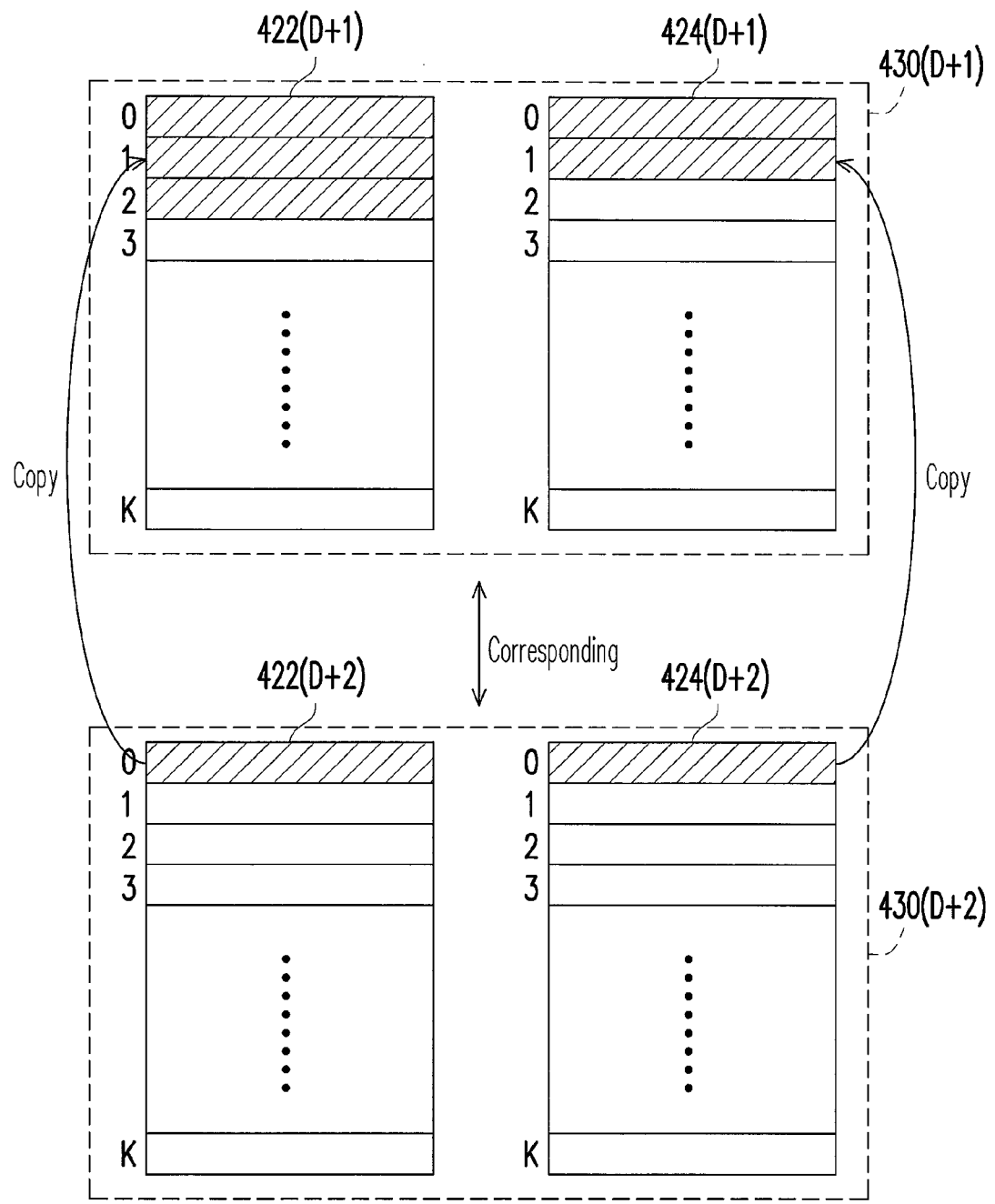

Referring to FIG. 10, when under the status shown in FIG. 9, the host system 1000 gives a fifth write command to write data starting from the $4^{th}$ logical address of the logical unit 460(0) and the data is the small data, the microprocessor unit 202 identifies that the $4^{th}$ physical address of the physical unit 430(D+1) (i.e., the $2^{nd}$ physical address of the physical block 422(D+1)) for writing the data is the fast physical address. Accordingly, the microprocessor unit 202 copies the data corresponding to the $2^{nd}$ and $3^{rd}$ physical address of the physical unit 430(D+1) from the midway cache physical unit 430(D+2) back to the $1^{st}$ physical address of the physical block 422(D+1) and the $1^{st}$ physical address of the physical block 424(D+1), and then writes the data corresponding to the fifth write command into the $2^{nd}$ physical address of the physical block 422(D+1). It should be noted that after the data corresponding to the $2^{nd}$ and $3^{rd}$ physical address of the physical unit 430(D+1) is copied back to the $1^{st}$ physical address of the physical block 422(D+1) and the $1^{st}$ physical address of the physical block 424(D+1), the data stored in the $0^{th}$ physical address of the physical block 422(D+2) and the $0^{th}$ physical address of the physical block 424(D+2) is marked as "invalid data".

In particular, the physical block 422(D+1) and the physical block 424(D+1) respectively belong to the first plane 412 and the second plane 414, therefore the microprocessor unit 202 programs the data corresponding to the $2^{nd}$ and $3^{rd}$ physical addresses of the physical unit 430(D+1) into the $1^{st}$ physical address of the physical block 422(D+1) and the $1^{st}$ physical address of the physical block 424(D+1) in a synchronization mechanism. Accordingly, the time of writing data can effectively be shortened. For example, in the exemplary embodiment, because the first and second planes are configured in the same flash memory die 402, the microprocessor unit 202 uses a two plane program command or a two plane copyback command to synchronously copy data corresponding to two physical addresses from the midway cache physical unit 430(D+2) to the physical unit 430(D+1). It should be understood that the number of physical addresses that are written synchronously is not limited to 2, and in another exemplary embodiment, the number of physical addresses that are written synchronously may be 3 or more. In this exemplary embodiment, the two plane program command could make two pages simultaneously programmable. And the two plane copyback command could simultaneously program data of two pages read from the flash memory chip 106 to other pages within the flash memory chip 106 without receiving data from the flash memory controller 104.

It should be noted that, in another exemplary embodiment, when the first plane 412 and the second plane 414 are configured respectively in different flash memory dies, for example, the microprocessor unit 202 uses an interleave mode to copy data corresponding to two physical addresses from the midway cache physical unit 430(D+2) to the physical unit 430(D+1) in a partial synchronization mechanism. To be specific, the procedure of writing data into a flash memory die may be divided into a data transfer portion and a data program portion. When the host system 1000 is about to store data in the flash memory storage apparatus 100, the microprocessor unit 202 of the flash memory controller 104 transmits data to a buffer of the flash memory die via a data bus, and then the flash memory die programs the data from the buffer into the cell of the flash memory die. Herein, the interleave mode means that in a case where two flash memory dies receive data via the same data bus, data is transmitted to one of the flash memory dies during a period that the other is performing the data program. Then, at least portion data in the two flash memory dies is programmed into cells in the synchronization mechanism.

Figure 11:
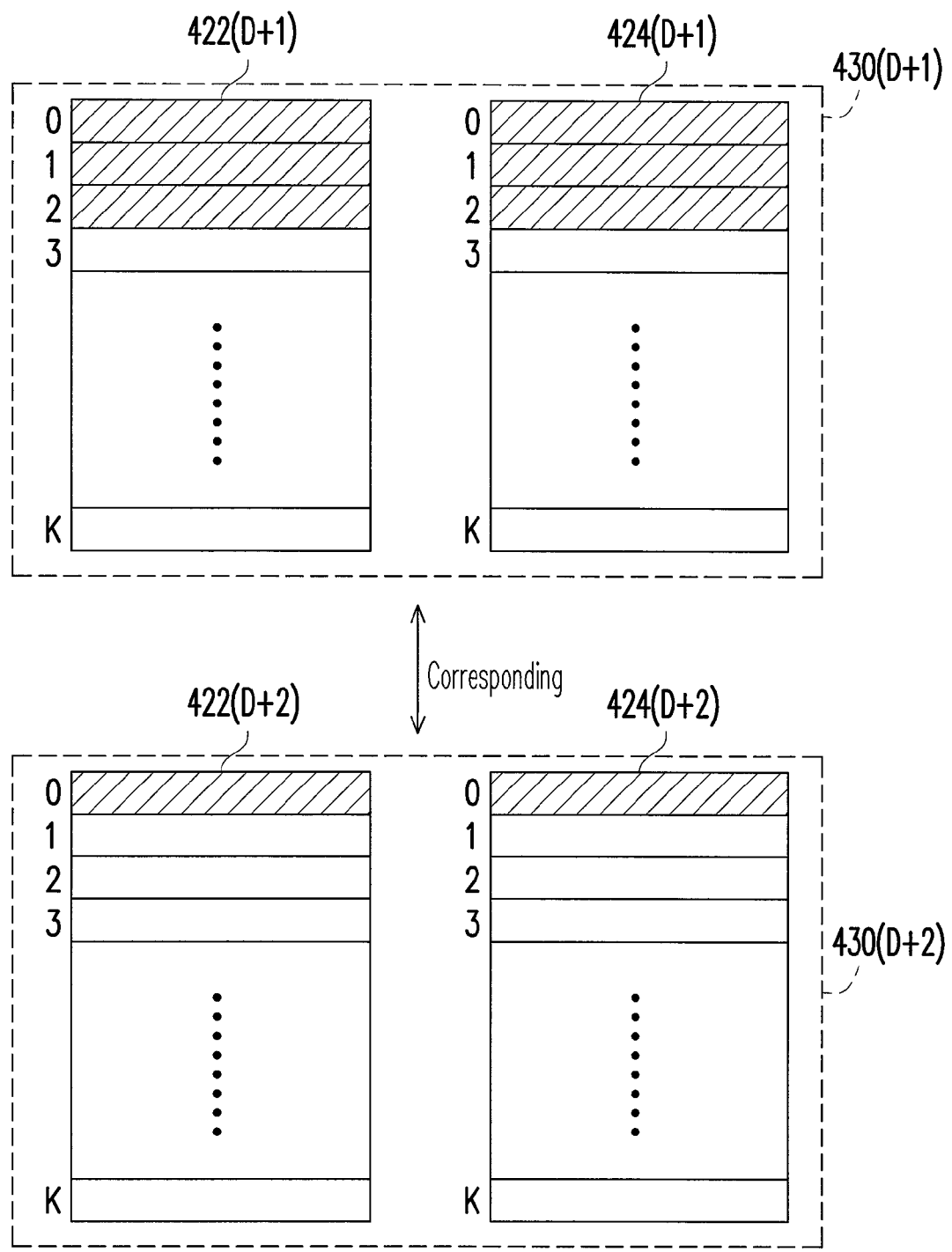

Referring to FIG. 11, when under the status shown in FIG. 10, the host system 1000 gives a sixth write command to write data starting from the $5^{th}$ logical address of the logical unit 460(0) and the data is the small data, the microprocessor unit 202 identifies that the $5^{th}$ physical address of the physical unit 430(D+1) (i.e., the $2^{nd}$ physical address of the physical block 424(D+1)) for writing the data is the fast physical address. Accordingly, the microprocessor unit 202 directly writes the data corresponding to the sixth write command into the $2^{nd}$ physical address of the physical block 424(D+1) of the physical unit 430 (D+1).

Figure 12:
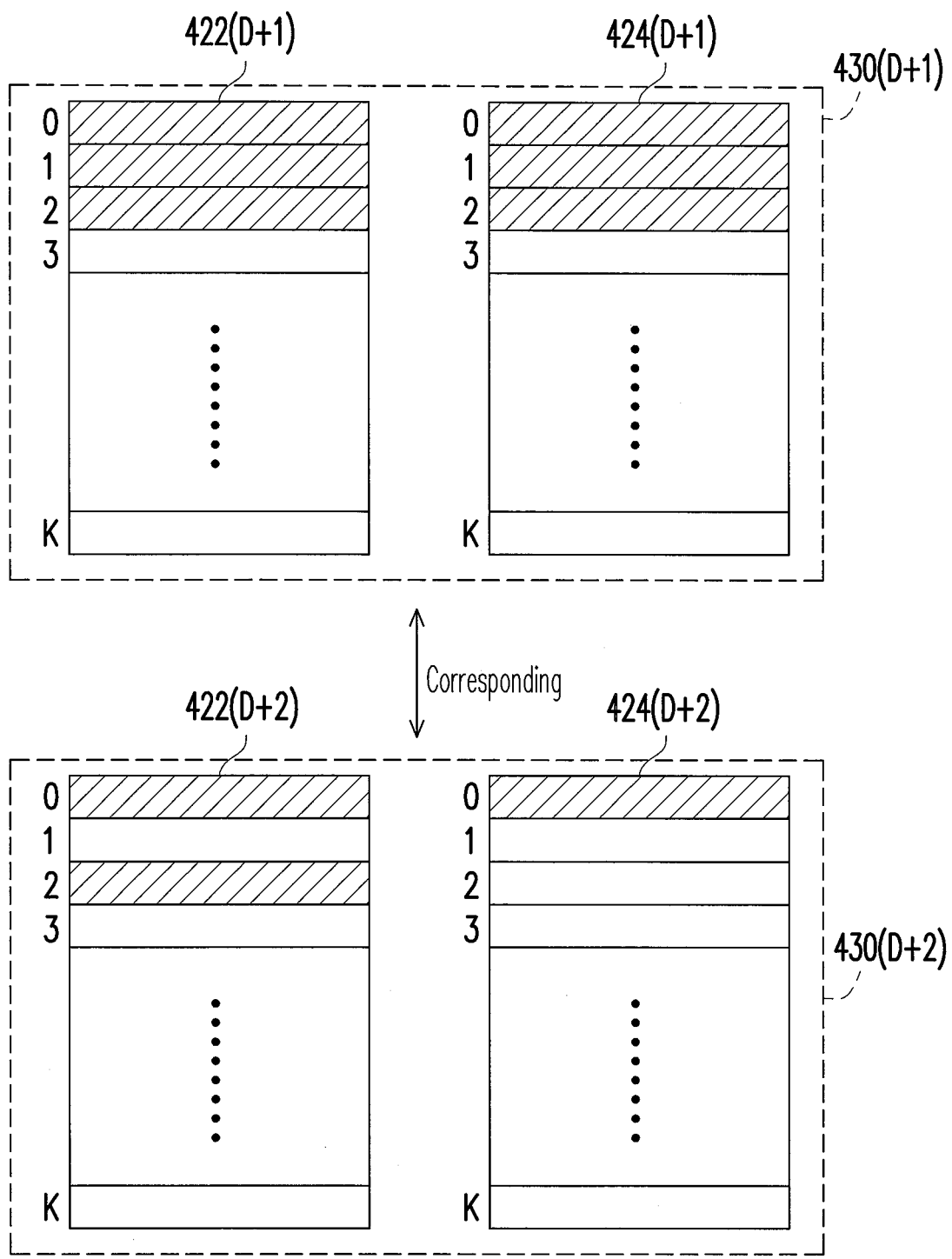

Referring to FIG. 12, when under the status shown in FIG. 11, the host system 1000 gives a seventh write command to write data starting from the $6^{th}$ logical address of the logical unit 460(0) and the data is the small data, the microprocessor unit 202 identifies that the $6^{th}$ physical address of the physical unit 430(D+1) (i.e., the $3^{rd}$ physical address of the physical block 422(D+1)) for writing the data is the slow physical address. Accordingly, the microprocessor unit 202 temporarily stores the data corresponding to the seventh write command in the fast physical address (i.e., the $2^{nd}$ physical address of the physical block 422(D+2)) of the midway cache physical unit 430(D+2).

Figure 13:
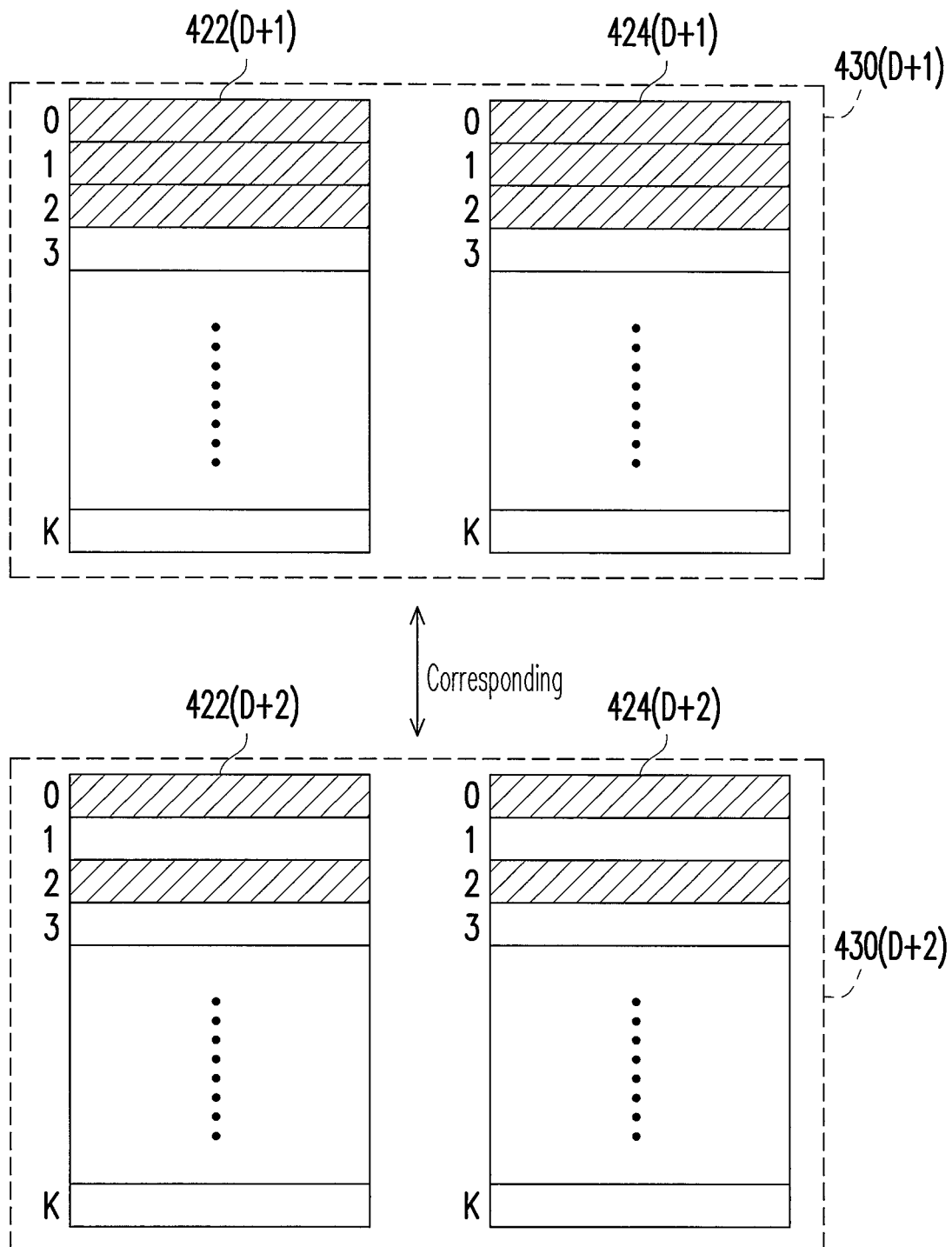

Referring to FIG. 13, when under the status shown in FIG. 12, the host system 1000 gives a eighth write command to write data starting from the $7^{th}$ logical address of the logical unit 460(0) and the data is the small data, the microprocessor unit 202 identifies that the $7^{th}$ physical address of the physical unit 430(D+1) (i.e., the $3^{rd}$ physical address of the physical block 424(D+1)) for writing the data is the slow physical address. Accordingly, the microprocessor unit 202 temporarily stores the data corresponding to the seventh write command in the fast physical address (i.e., the $2^{nd}$ physical address of the physical block 424(D+2)) of the midway cache physical unit 430(D+2).

Figure 14:
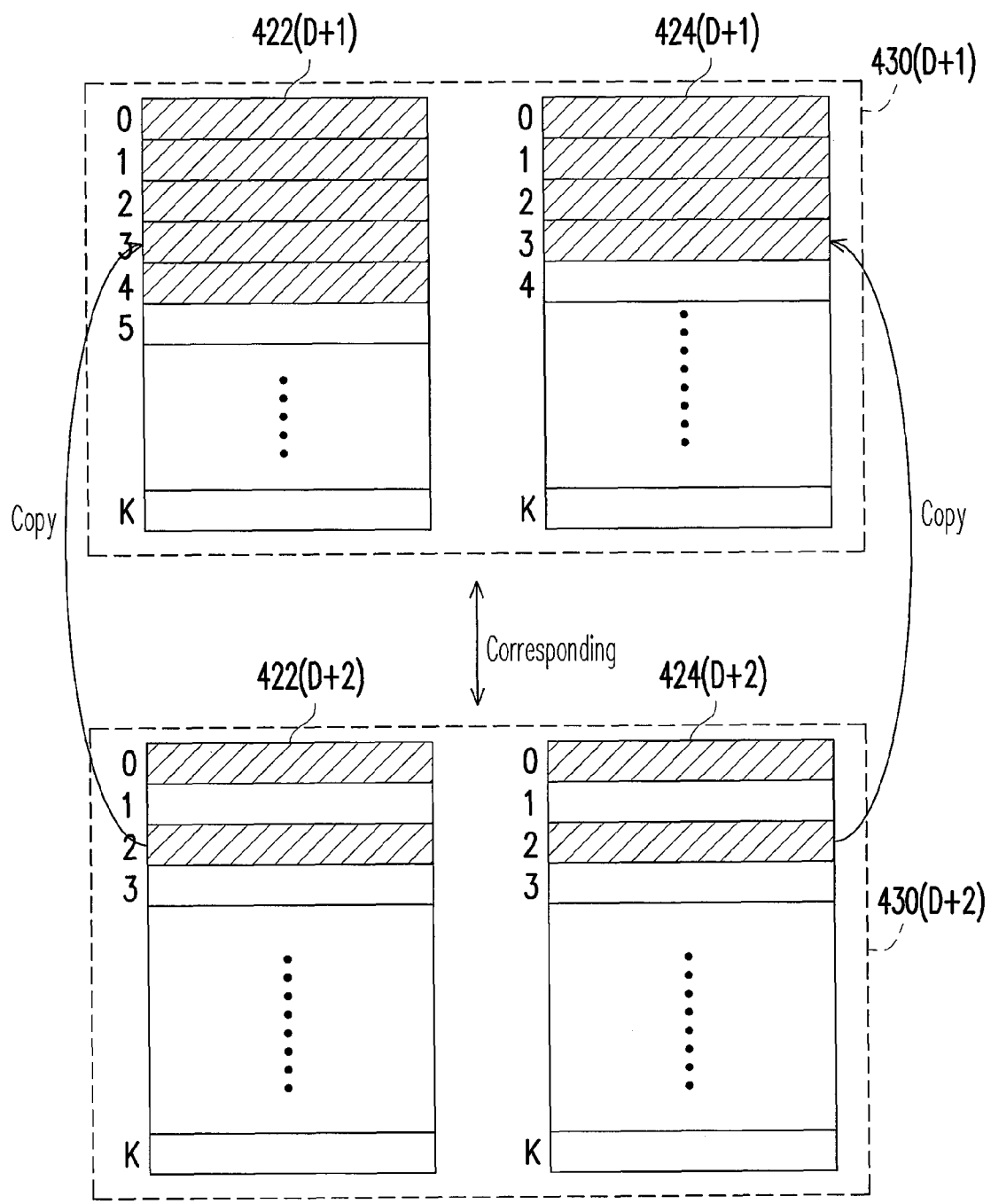

Referring to FIG. 14, when under the status shown in FIG. 13, the host system 1000 gives a ninth write command to write data starting from the $8^{th}$ logical address of the logical unit 460(0) and the data is the small data, the microprocessor unit 202 identifies that the $8^{th}$ physical address of the physical unit 430(D+1) (i.e., the $4^{th}$ physical address of the physical block 422(D+1)) for writing the data is the fast physical address. Accordingly, the microprocessor unit 202 copies the data corresponding to the $6^{th}$ and $7^{th}$ physical address of the physical unit 430(D+1) from the midway cache physical unit 430(D+2) back to the $3^{rd}$ physical address of the physical block 422(D+1) and the $3^{rd}$ physical address of the physical block 424(D+1), and then writes the data corresponding to the ninth write command into the $4^{th}$ physical address of the physical block 422(D+1). And, the data stored in the $2^{nd}$ physical address of the midway physical block 422(D+2) and the $2^{nd}$ physical address of the midway physical block 424(D+2) is marked as "invalid data". Similarly, the physical block 422(D+1) and the physical block 424(D+1) respectively belong to the first plane 412 and the second plane 414, therefore the microprocessor unit 202 programs the data corresponding to the $6^{th}$ and $7^{th}$ physical addresses of the physical unit 430(D+1) into the $3^{rd}$ physical address of the physical block 422(D+1) and the $3^{rd}$ physical address of the physical block 424(D+1) in the synchronization mechanism. Accordingly, the time of writing data can effectively be shortened.

In the exemplary embodiment, when the physical addresses of a physical unit has been full with data, the microprocessor unit 202 performs an erasing operation to a midway cache physical unit corresponding to the physical unit and associated the erased physical unit with the spare area 304b. It is should be noted that the microprocessor unit 202 may configure several midway cache physical unit for physical units mapped to several logical units. That is, under a case where the spare area 304b has enough physical units, the microprocessor unit 202 may configure several midway cache physical unit for physical units mapped to several logical units, respectively, thereby increasing the speed of writing data.

According to the above-mentioned examples, the microprocessor unit 202 temporarily stores data, that is small data and programmed into slow physical addresses, in the fast physical addresses of a corresponding midway cache physical unit, and then writes the data into several slow physical addresses of a physical unit together in the synchronization mechanism when the quantity of the data reaches a predetermined value, thereby increasing the efficiency of writing data. It should be noted that in the above-mentioned examples, the flash memory chip 106 is a 2 level cell NAND flash memory chip, therefore the microprocessor unit 202 writes the temporarily stored small data into corresponding physical addresses when 2 pieces of small data belonging to slow physical addresses is successively written in a physical unit. Accordingly, the predetermined value is set as 2. However, it should be noted that the present invention is not limited thereto and the predetermined value may be set to other suitable values based on different MLC NAND flash memory chip.

For example, taking the write commands described in FIGS. 6~10 as an example, the time for executing five host system commands includes the time for programming five fast physical addresses and the time for programming one slow physical address in the exemplary embodiment. However, in the same example, the time for executing five host system commands includes the time for programming third fast physical addresses and the time for programming two slow physical addresses according to the general writing operation. As described above, the speed of writing data into the fast physical addresses is far faster than that of writing data into the slow physical addresses. Compared to the general writing operation, the time for programming two fast physical addresses is needed additionally, but the time for programming one fast physical address is saved. Therefore, the flash memory storage apparatus 100 according to the exemplary embodiment is capable of shortening the time for writing data.

Based on this principle, in a 3 level cell or other MLC NAND memory chip, data to be written into slow physical addresses may be stored in middle or fast physical addresses, or data to be written into slow or middle physical addresses may be stored in fast physical addresses. After that, when the size of data temporarily stored in fast physical addresses is equal to the number of physical addresses that can be written simultaneously by one multi-plane copyback command or one multi-plane program, the temporarily stored data is written into corresponding middle or slow physical addresses by using the multi-plane copyback command or the multi-plane program.

Similarly, in another exemplary embodiment, in a 3 level cell or other MLC NAND memory chip, data to be written into slow physical addresses may be stored in middle or fast physical addresses, or data to be written into slow or middle physical addresses may be stored in fast physical addresses. After that, when the quantity of data temporarily stored in fast physical addresses is not smaller than the size of two physical pages, the temporarily stored data is written into corresponding middle or slow physical addresses in the partial synchronization mechanism by performing the interleave mode.

Figure 15:
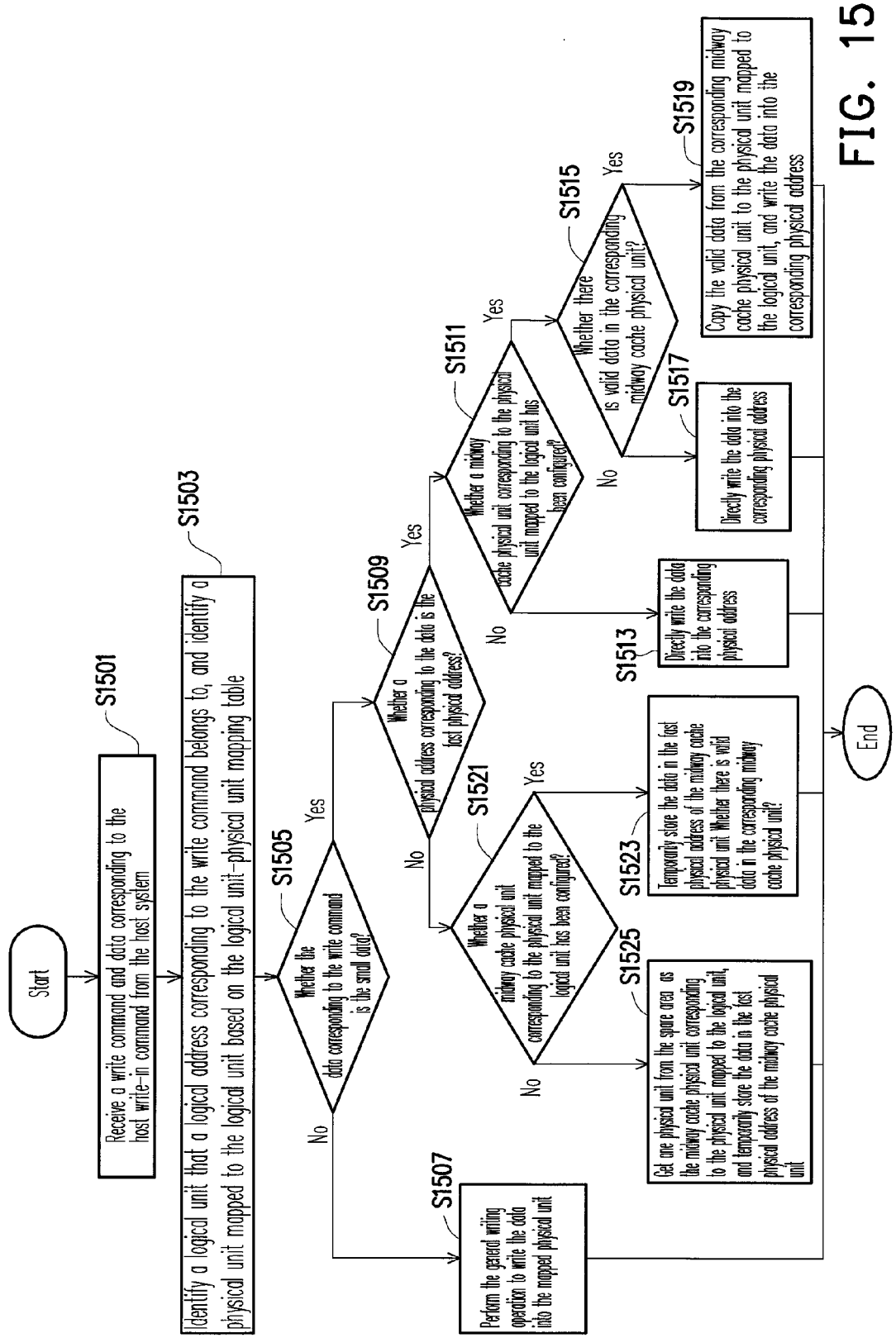
FIG. 15 is a flowchart illustrating a data writing method according to one exemplary embodiment of the present invention.

FIG. 15 is a flowchart illustrating a data writing method according to one exemplary embodiment of the present invention.

Referring to FIG. 15, in step S1501, the microprocessor unit 202 receives a write command and data corresponding to the write command from the host system 1000.

In step S1503, the microprocessor unit 202 identifies a logical unit that a logical address corresponding to the write command belongs to, and identifies a physical unit mapped to the logical unit based on the logical unit-physical unit mapping table. And, in step S1505, the microprocessor unit 202 determines whether the data corresponding to the write command is the small data.

If the data corresponding to the write command is not the small data, then in step S1507, the microprocessor unit 202 performs the general writing operation (as shown in FIG. 5B-5C) to write the data into the mapped physical unit.

If in step S1505, it is determined that the data corresponding to the write command is the small data, then in step S1509, the microprocessor unit 202 determines whether a physical address corresponding to the data (i.e., a physical address mapped to the logical address corresponding to the write command) is the fast physical address. If the physical address corresponding to the data is the fast physical address, then in step S1511, the microprocessor unit 202 determines whether a midway cache physical unit corresponding to the physical unit mapped to the logical unit has been configured.

If the midway cache physical unit corresponding to the physical unit mapped to the logical unit has not been configured, then in step S1513, the microprocessor unit 202 directly writes the data into the corresponding physical address (as the operation shown in FIGS. 6 and 7).

If the midway cache physical unit corresponding to the physical unit mapped to the logical unit has been configured, then in step S1515, the microprocessor unit 202 determines whether there is valid data in the corresponding midway cache physical unit (i.e., whether valid data corresponding to physical addresses which are before the physical address corresponding to the write command is temporarily stored in the midway cache physical unit).

If in step S1515, there is no valid data in the corresponding midway cache physical unit, then in step S1517, the microprocessor unit 202 directly writes the data into the corresponding physical address (as the operation shown in FIG. 11). If there is valid data in the corresponding midway cache physical unit, then in step S1519, the microprocessor unit 202 copies the valid data from the corresponding midway cache physical unit to the physical unit mapped to the logical unit, and writes the data into the corresponding physical address (as the operation shown in FIG. 10).

If in step S1509, it is determined that the physical address corresponding to the data is not the fast physical address, then in step S1521, the microprocessor unit 202 determines whether a midway cache physical unit corresponding to the physical unit mapped to the logical unit has been configured. If the midway cache physical unit corresponding to the physical unit mapped to the logical unit has been configured, then in step S1523, the microprocessor unit 202 temporarily stores the data in the fast physical address of the midway cache physical unit (as the operation shown in FIGS. 9, 12 and 13).

If a midway cache physical unit corresponding to the physical unit mapped to the logical unit has not been configured, then in step S1525, the microprocessor unit 202 gets one physical unit from the spare area 304b as the midway cache physical unit corresponding to the physical unit mapped to the logical unit, and temporarily stores the data in the fast physical address of the midway cache physical unit (as the operation shown in FIG. 8).

In summary, the data writing method according to the exemplary embodiment temporarily stores a plurality of small data in the fast physical addresses of the midway cache physical unit, and then writes the small data into the corresponding slow physical address in the synchronization mechanism by synchronously performing program commands in physical blocks of several planes. Accordingly, the time for writing data can effectively be shortened, and thus the performance of a flash memory storage apparatus can effectively be improved. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A flash memory storage system, comprising:
   a flash memory chip, having a first plane and a second plane, the first and second planes respectively have a plurality of physical blocks, each of the physical block has a plurality of physical addresses, the physical addresses include a plurality of fast physical addresses and a plurality of slow physical addresses, and a speed of writing data into the fast physical addresses is faster than a speed of writing data into the slow physical addresses;
   a connector, configured to couple to a host system; and
   a flash memory controller, coupled to the flash memory chip and the connector and configured to perform:
      grouping the physical blocks of the first and second planes into a plurality of physical units and grouping a portion of the physical units into a data area and a spare area, wherein each of the physical units includes one of the physical blocks of the first plane and one of the physical blocks of the second plane;
      receiving first data corresponding to a first write command, wherein the first data corresponds to a first physical block of a first physical unit among the physical units and the first physical unit belongs to the first plane;
      getting one of the physical units of the spare area as a midway cache physical unit corresponding to the first physical unit;
      determining whether the first data is small data and corresponds to a first slow physical address among the slow physical addresses of the first physical block of the first physical unit, wherein if the size of the first data is not bigger than a predetermined threshold, then the first data is determined to be the small data; and
      if the first data is the small data and corresponds to the first slow physical address among the slow physical addresses of the first physical block of the first physical unit, then temporarily storing the first data in one of the fast physical addresses of a first physical block of the midway cache physical unit; if the first data is not the small data or does not correspond to the first slow physical address among the slow physical addresses of the first physical block of the first physical unit, then not temporarily storing the first data in one of the fast physical addresses of a first physical block of the midway cache physical unit,
      wherein the first physical block of the midway cache physical unit belongs to the first plane.

2. The flash memory storage system according to claim 1, wherein the flash memory controller is further to perform:
   receiving second data corresponding to a second write command, wherein the second data corresponds to a second physical block of the first physical unit and the second physical block of the first physical unit belongs to the second plane;
   determining whether the second data is the small data and corresponds to a second slow physical address among the slow physical addresses of the second physical block of the first physical unit; and
   temporarily storing the second data in one of the fast physical addresses of a second physical block of the midway cache physical unit when the second data is the small data and corresponds to the second slow physical address among the slow physical addresses of the second physical block of the first physical unit,
   wherein the second physical block of the midway cache physical unit belongs to the second plane.

3. The flash memory storage system according to claim 2, wherein the flash memory controller is further to perform:
   reading the first data and the second data from the midway cache physical unit and respectively write the first data and the second data into the first slow physical address and the second slow physical address,
   wherein at least portion of the first data and at least portion of the second data are written into the first slow physical address and the second slow physical address in a synchronization mechanism.

4. The flash memory storage system according to claim 3, wherein the flash memory controller is further to perform an erasing operation to the midway cache physical unit and associate the erased midway cache physical unit with the spare area when the first physical unit has been full with data.

5. The flash memory storage system according to claim 3, wherein the flash memory controller is further to use a copy-back command to read the first data and the second data from the midway cache physical unit and respectively write the first data and the second data into the first slow physical address and the second slow physical address in the synchronization mechanism.

6. A flash memory controller, for writing a plurality of data into a flash memory chip, wherein the flash memory chip has a first plane and a second plane, the first and second planes respectively have a plurality of physical blocks, each of the physical block has a plurality of physical addresses, the physical addresses include a plurality of fast physical addresses and a plurality of slow physical addresses, and a speed of writing data into the fast physical addresses is faster than a speed of writing data into the slow physical addresses, the flash memory controller comprising:

a microprocessor unit;

a flash memory interface unit, coupled to the microprocessor unit, and configured to couple to the flash memory chip;

a host interface unit, coupled to the microprocessor unit and configured to couple to the host system; and a memory management unit, coupled to the microprocessor unit and has a plurality of program codes for providing to the microprocessor unit to perform:

grouping the physical blocks of the first and second planes into a plurality of physical units and grouping a portion of the physical units into a data area and a spare area, wherein each of the physical units includes one of the physical blocks of the first plane and one of the physical blocks of the second plane;

receiving first data corresponding to a first write command, wherein the first data corresponds to a first physical block of a first physical unit among the physical units and the first physical unit belongs to the first plane;

getting one of the physical units of the spare area as a midway cache physical unit corresponding to the first physical unit;

determining whether the first data is small data and corresponds to a first slow physical address among the slow physical addresses of the first physical block of the first physical unit, wherein if the size of the first data is not bigger than a predetermined threshold, then the first data is determined to be the small data; and if the first data is the small data and corresponds to the first slow physical address among the slow physical addresses of the first physical block of the first physical unit, then temporarily storing the first data in one of the fast physical addresses of a first physical block of the midway cache physical unit; if the first data is not the small data or does not correspond to the first slow physical address among the slow physical addresses of the first physical block of the first physical unit, then not temporarily storing the first data in one of the fast physical addresses of a first physical block of the midway cache physical unit, wherein the first physical block of the midway cache physical unit belongs to the first plane.

7. The flash memory controller according to claim 6, wherein the microprocessor unit is further to perform:

receiving second data corresponding to a second write command, wherein the second data corresponds to a second physical block of the first physical unit and the second physical block of the first physical unit belongs to the second plane;

determining whether the second data is the small data and corresponds to a second slow physical address among the slow physical addresses of the second physical block of the first physical unit; and temporarily storing the second data in one of the fast physical addresses of a second physical block of the midway cache physical unit when the second data is the small data and corresponds to the second slow physical address among the slow physical addresses of the second physical block of the first physical unit, wherein the second physical block of the midway cache physical unit belongs to the second plane.

8. The flash memory controller according to claim 7, wherein the microprocessor unit is further to perform:

reading the first data and the second data from the midway cache physical unit and respectively write the first data and the second data into the first slow physical address and the second slow physical address, wherein at least portion of the first data and at least portion of the second data are written into the first slow physical address and the second slow physical address in a synchronization mechanism.

9. A data writing method, for writing a plurality of data into a flash memory chip, wherein the flash memory chip has a first plane and a second plane, the first and second planes respectively have a plurality of physical blocks, each of the physical block has a plurality of physical addresses, the physical addresses include a plurality of fast physical addresses and a plurality of slow physical addresses, and a speed of writing data into the fast physical addresses is faster than a speed of writing data into the slow physical addresses, the data writing method comprising:

grouping the physical blocks of the first and second planes into a plurality of physical units and grouping a portion of the physical units into a data area and a spare area, wherein each of the physical units includes one of the physical blocks of the first plane and one of the physical blocks of the second plane;

receiving first data corresponding to a first write command, wherein the first data corresponds to a first physical block of a first physical unit among the physical units and the first physical unit belongs to the first plane;

getting one of the physical units of the spare area as a midway cache physical unit corresponding to the first physical unit;

determining whether the first data is small data and corresponds to a first slow physical address among the slow physical addresses of the first physical block of the first physical unit, wherein if the size of the first data is not bigger than a predetermined threshold, then the first data is determined to be the small data; and if the first data is the small data and corresponds to the first slow physical address among the slow physical addresses of the first physical block of the first physical unit, then temporarily storing the first data in one of the fast physical addresses of a first physical block of the midway cache physical unit; if the first data is not the small data or does not correspond to the first slow physical address among the slow physical addresses of the first physical block of the first physical unit, then not temporarily storing the first data in one of the fast physical addresses of a first physical block of the midway cache physical unit, wherein the first physical block of the midway cache physical unit belongs to the first plane.

10. The data writing method according to claim 9 further comprising:

receiving second data corresponding to a second write command, wherein the second data corresponds to a second physical block of the first physical unit and the second physical block of the first physical unit belongs to the second plane;

determining whether the second data is the small data and corresponds to a second slow physical address among the slow physical addresses of the second physical block of the first physical unit; and temporarily storing the second data in one of the fast physical addresses of a second physical block of the midway cache physical unit when the second data is the small data and corresponds to the second slow physical address among the slow physical addresses of the second physical block of the first physical unit, wherein the second physical block of the midway cache physical unit belongs to the second plane.

11. The data writing method according to claim 10 further comprising:
reading the first data and the second data from the midway cache physical unit and respectively writing the first data and the second data into the first slow physical address and the second slow physical address,
wherein at least portion of the first data and at least portion of the second data are written into the first slow physical address and the second slow physical address in a synchronization mechanism.

12. The data writing method according to claim 11 further comprising:
performing an erasing operation to the midway cache physical unit and associating the erased midway cache physical unit with the spare area when the first physical unit has been full with data.

13. The data writing method according to claim 11, wherein the step of reading the first data and the second data from the midway cache physical unit and respectively writing the first data and the second data into the first slow physical address and the second slow physical address comprises:
using a copyback command to read the first data and the second data from the midway cache physical unit and respectively write the first data and the second data into the first slow physical address and the second slow physical address in the synchronization mechanism.

* * * * *